United States Patent [19]
Cresswell et al.

[11] Patent Number: 5,617,340
[45] Date of Patent: Apr. 1, 1997

[54] METHOD AND REFERENCE STANDARDS FOR MEASURING OVERLAY IN MULTILAYER STRUCTURES, AND FOR CALIBRATING IMAGING EQUIPMENT AS USED IN SEMICONDUCTOR MANUFACTURING

[75] Inventors: Michael W. Cresswell, Frederick; Richard A. Allen, Germantown; Joseph J. Kopanski, Takoma Park; Loren W. Linholm, Ijamsville, all of Md.

[73] Assignee: The United States of America as represented by the Secretary of Commerce, Washington, D.C.

[21] Appl. No.: 382,973

[22] Filed: Feb. 3, 1995

Related U.S. Application Data

[63] Continuation-in-part of Ser. No. 236,202, Apr. 28, 1994.

[51] Int. Cl.⁶ .................. G01B 11/27; G01D 18/00
[52] U.S. Cl. ..................... 364/571.01; 364/559
[58] Field of Search ................. 250/491.1; 257/48; 156/626.1, 627.1; 437/8; 324/719, 602, 765, 699, 691, 716; 348/87, 94, 95; 356/399, 394, 373; 364/559, 571.01, 579; 430/22, 30

[56] References Cited

U.S. PATENT DOCUMENTS

| | | | |
|---|---|---|---|
| 3,974,443 | 8/1976 | Thomas | 324/64 |
| 4,481,616 | 11/1984 | Matey | 369/58 |
| 4,516,071 | 5/1985 | Buehler | 324/158 R |
| 4,538,105 | 8/1985 | Ausschnitt | 324/158 R |
| 4,571,538 | 2/1986 | Chow | 324/65 R |
| 4,672,314 | 6/1987 | Kokkas | 324/158 R |
| 4,810,335 | 3/1989 | Hieber | 204/192.33 |
| 4,918,377 | 4/1990 | Buehler et al. | 324/691 |
| 4,983,908 | 1/1991 | Tada et al. | 324/158 P |
| 5,140,272 | 8/1992 | Nishimatsu et al. | 324/662 |
| 5,280,437 | 1/1994 | Corliss | 364/559 |

OTHER PUBLICATIONS

Yen et al, "A Cross-Bridge . . . ", *J. Electrochem Solid-State Science and Technology* Oct. 1982, pp. 2313–2318.

Feldbaumer et al, "Design and Application . . . ", *IEEE Transactions on Semiconductor Manufacturing*, vol 3, No. 4, Nov. 1990, 206–215.

Troccolo et al, "Extending Electrical . . . ", *SPIE*, vol. 1441, pp. 90–103.

Cresswell et al, "A Modified Sliding Wire . . . ", *IEEE Int. Conference on Microelectronic Test Structures*, vol. 4, No. 1, Mar. 1991.

(List continued on next page.)

*Primary Examiner*—Edward R. Cosimano
*Assistant Examiner*—Tony M. Cole
*Attorney, Agent, or Firm*—Michael de Angeli

[57] ABSTRACT

Imaging instruments for inspecting products, such as semiconductor chips, are calibrated by providing a reference test structure having features which can be located by electrical measurements not subject to tool-induced shift and wafer-induced shift experienced by the imaging instrument. The reference test structure is first qualified using electrical measurements, and is then used to calibrate the imaging instrument. The electrical measurements may be made by forcing a current between a plurality of spaced reference features and an underlying conductor, or may be made by capacitive, conductive, magnetic, or impedance-measuring techniques. Capacitive techniques may also be used to detect features not susceptible of resistance measurement, such as dielectric or insulative materials, or metallic structures not accessible for forcing a current therethrough. A series of test structure elements may be fabricated with one component of each being spaced at progressively greater distances from an arbitrary baseline, such that a null-overlay element may be identified.

36 Claims, 6 Drawing Sheets

OTHER PUBLICATIONS

Buehler et al., "The Split–Cross–Bridge . . . ", *IEEE Transactions on Electronic Devices,* vol. ED–33, No. Oct. 1986.

Troccolo et al, "Tool and mark design . . . ", *SPIE* vol. 1673, 1992, 148–156.

Allen et al, "Voltage–Diving Potentiometer", *Proc. IEEE Int. Conference on Microelectronic Test Structures,* vol. 5, Mar. 1992, 174–179.

Kuroki et al, "X–ray Exposure Mask . . . "*Proc. IEEE Int. Conference on Microelectronic Test Structures,* vol. 4, No. 1, Mar. 1991, 123–134.

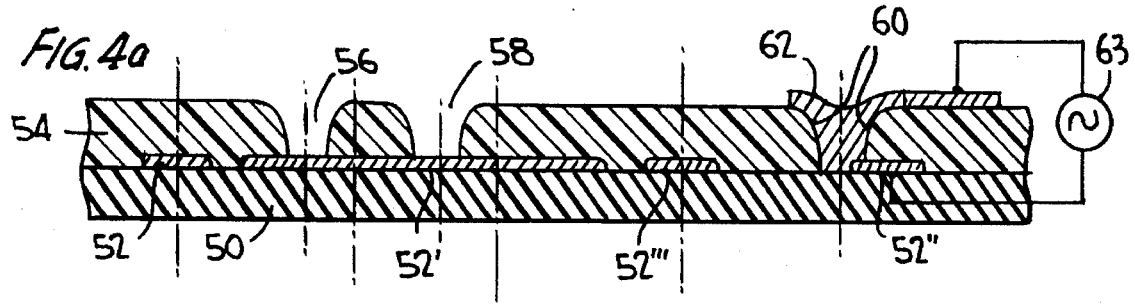
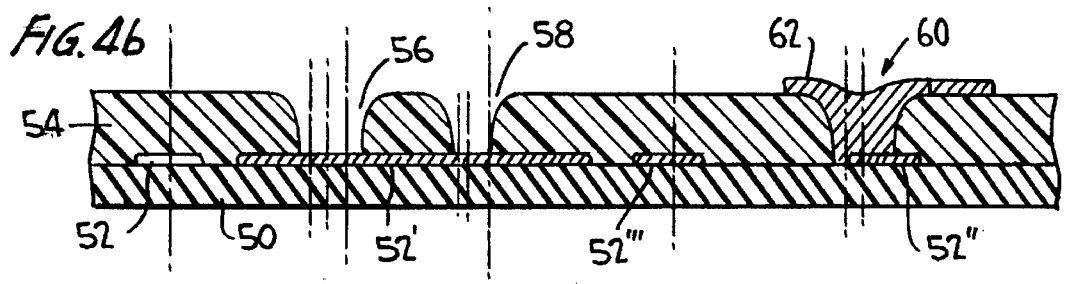
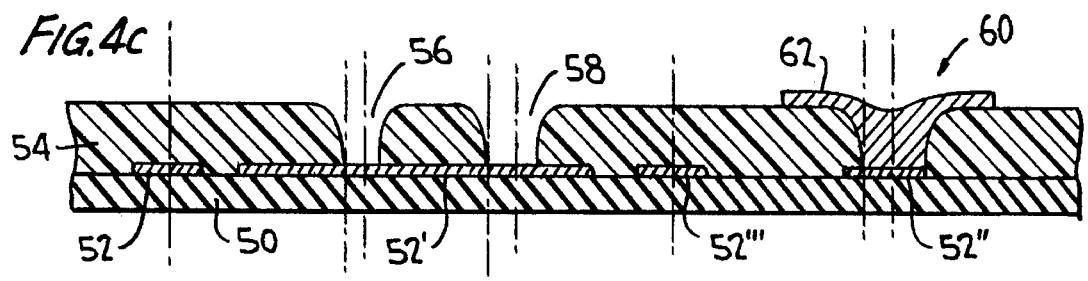
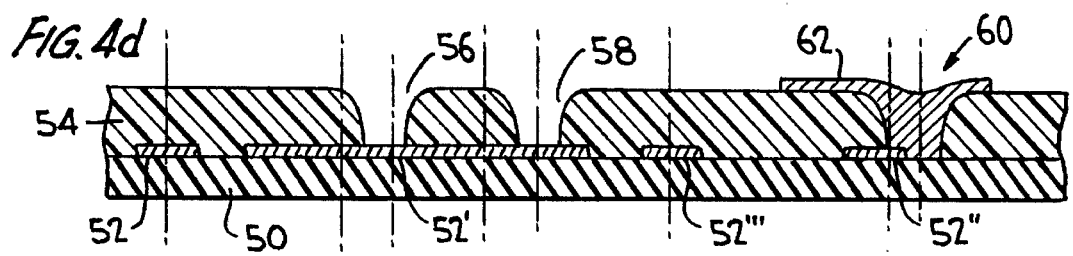
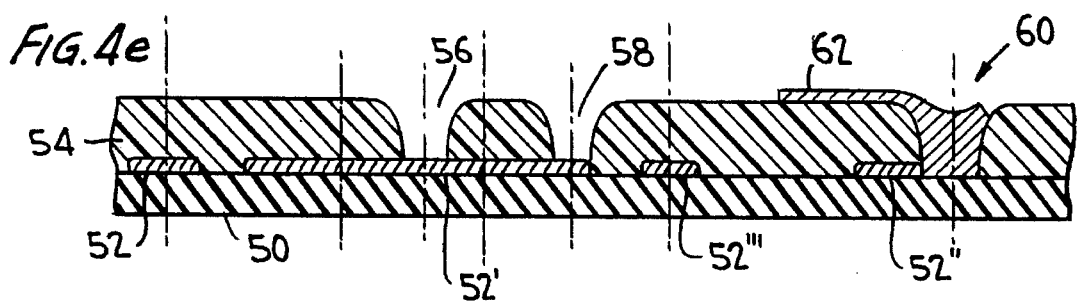

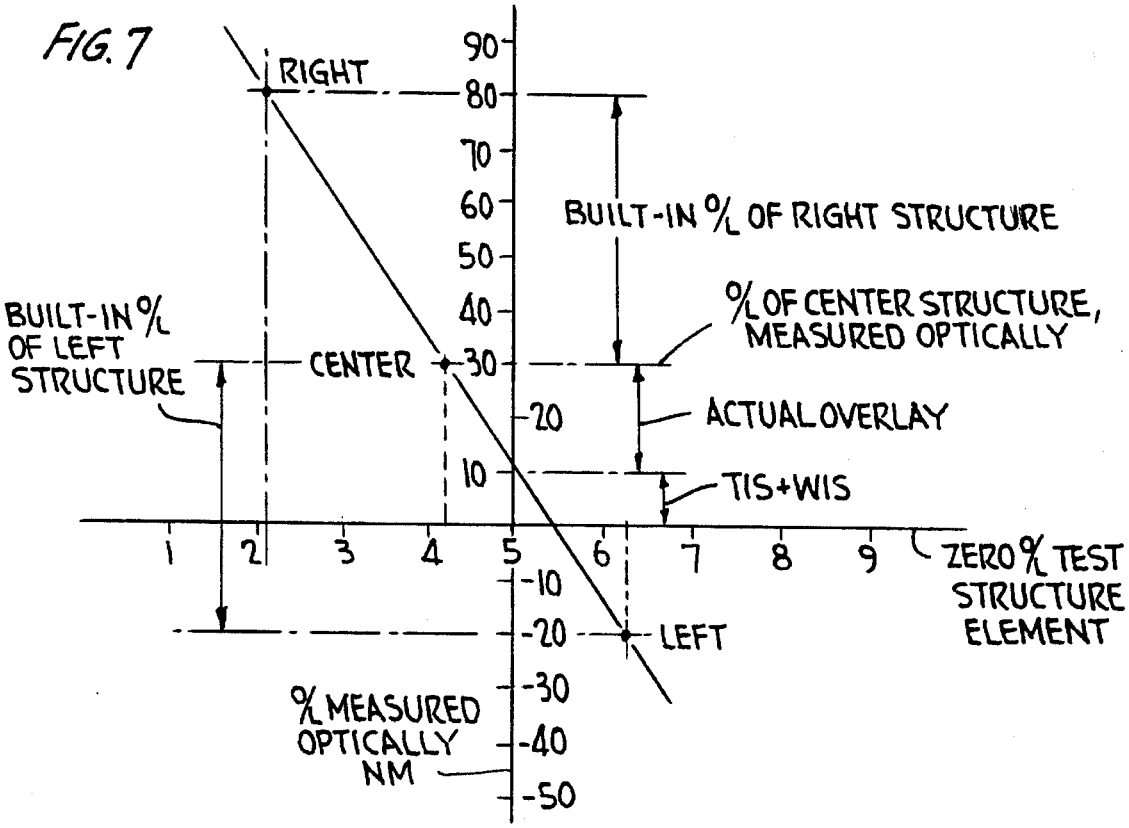

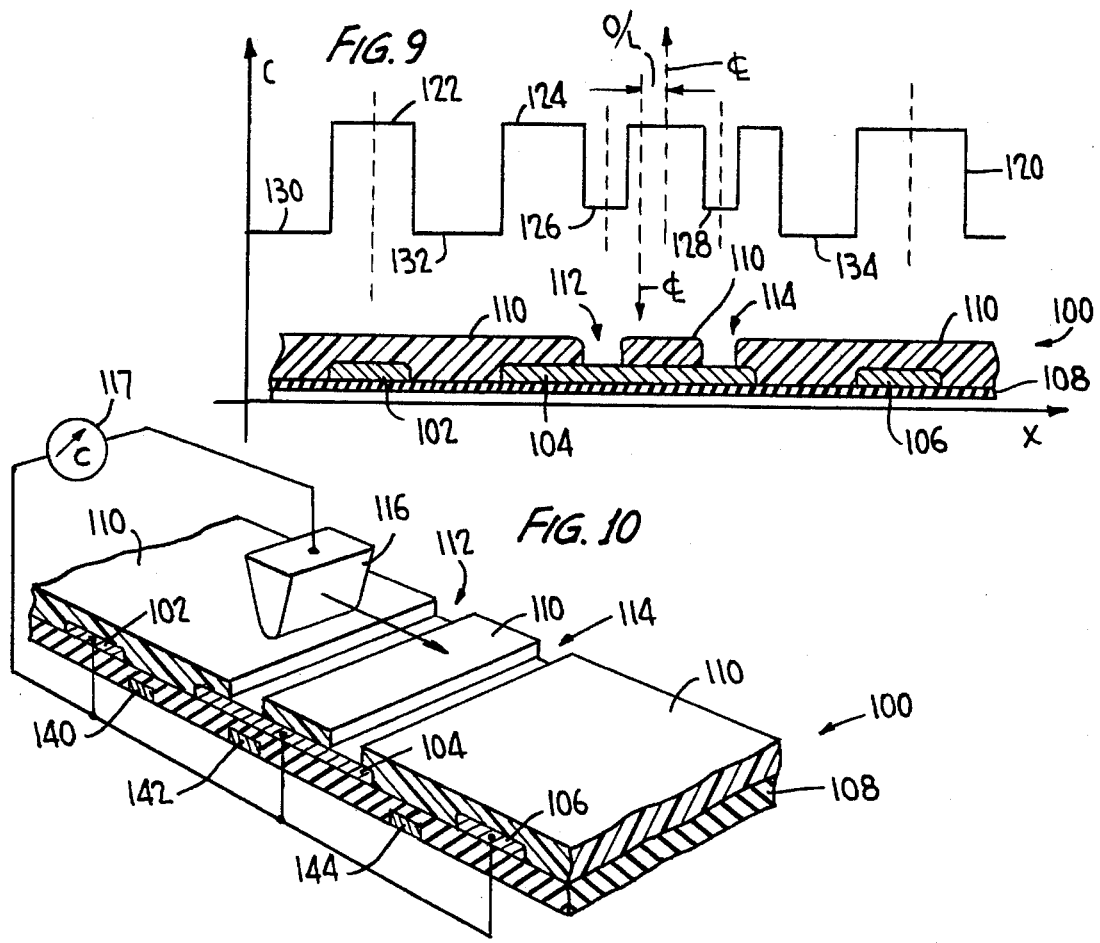
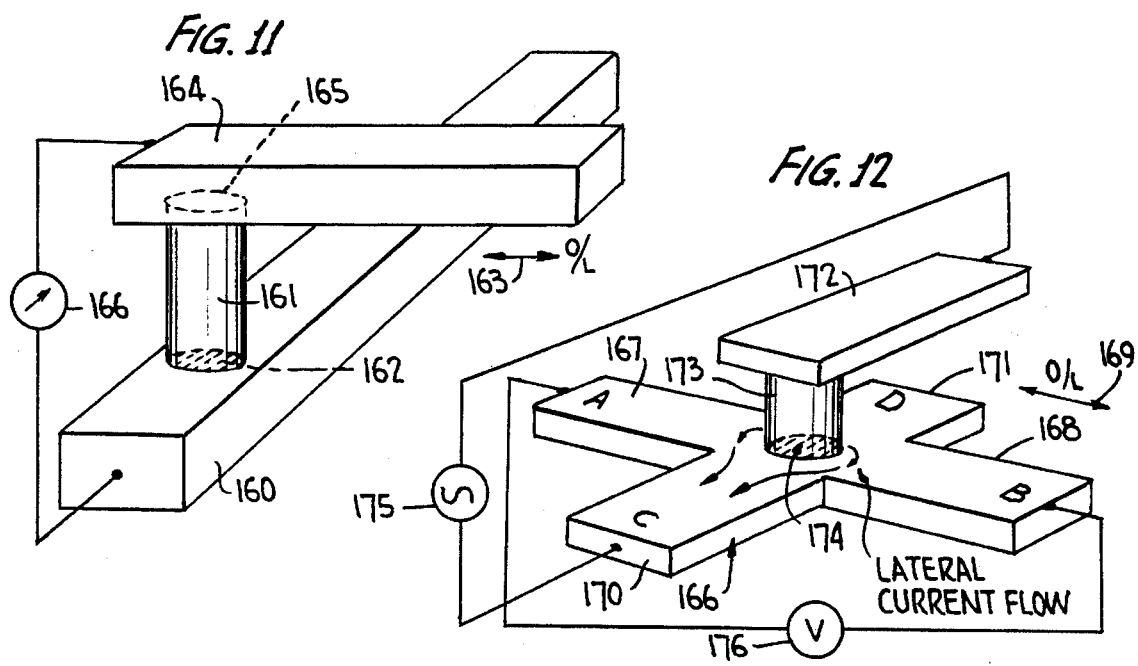

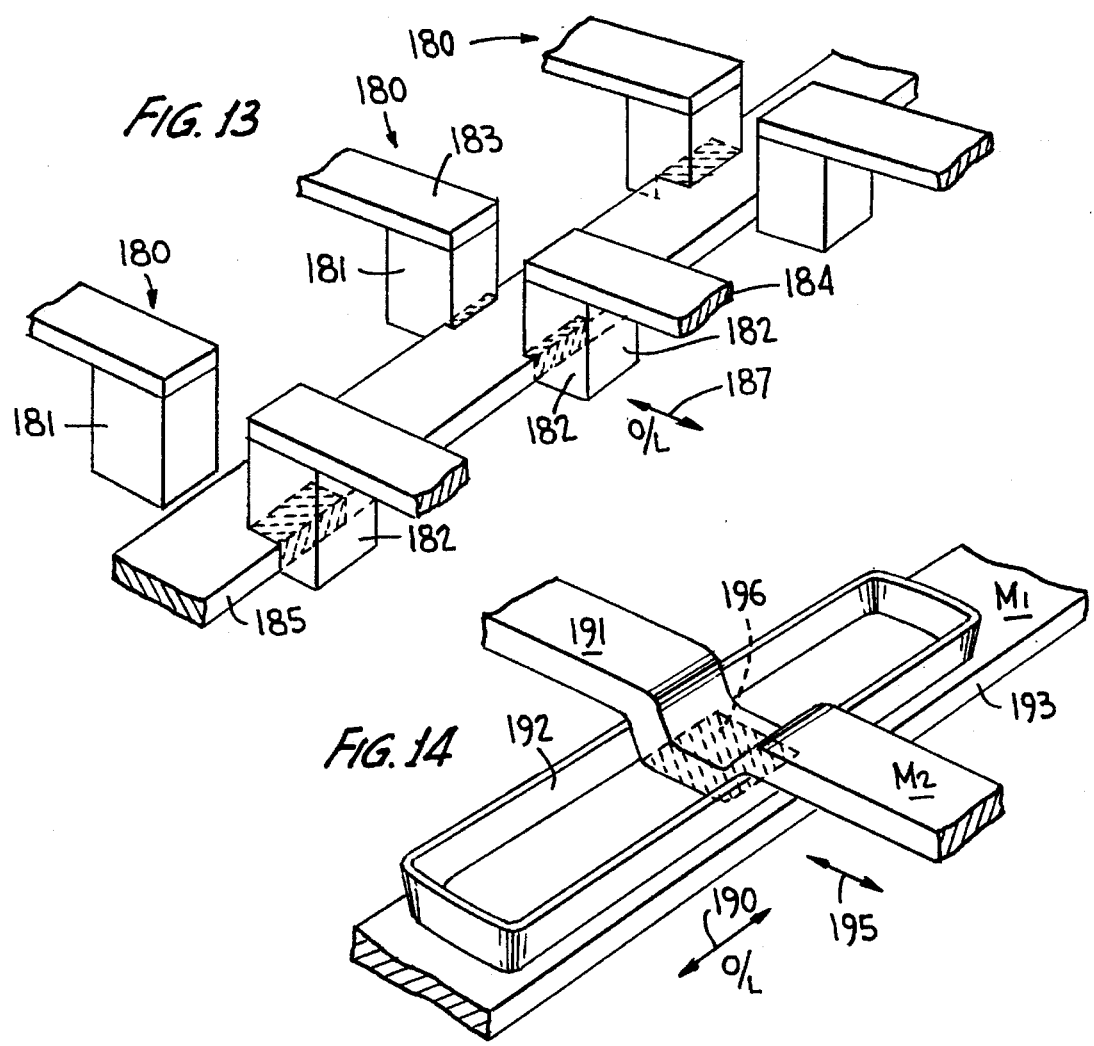
FIG. 13
FIG. 14
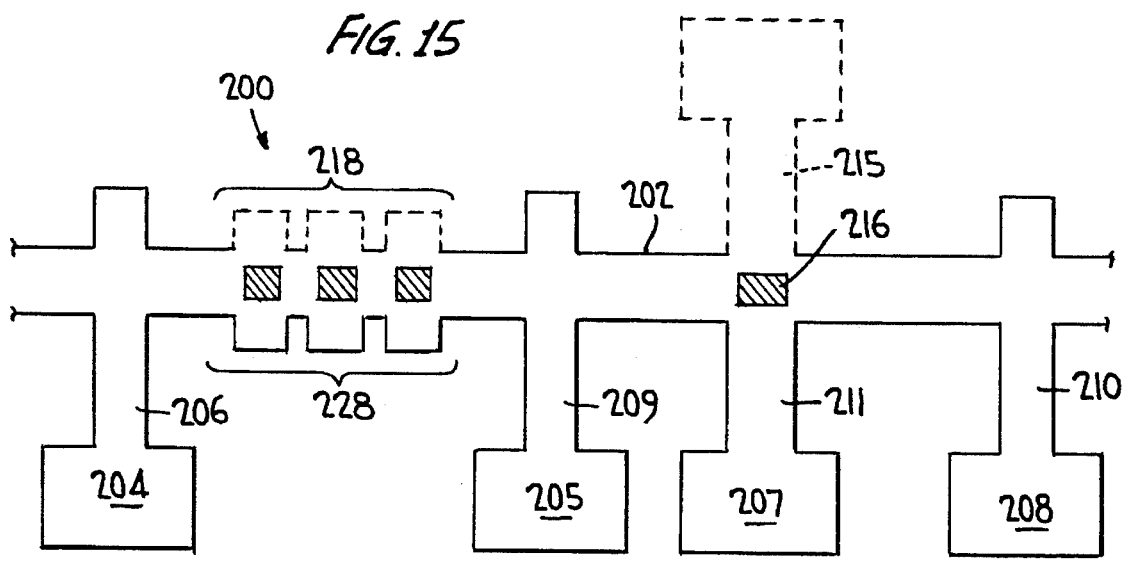
FIG. 15

METHOD AND REFERENCE STANDARDS FOR MEASURING OVERLAY IN MULTILAYER STRUCTURES, AND FOR CALIBRATING IMAGING EQUIPMENT AS USED IN SEMICONDUCTOR MANUFACTURING

CROSS-REFERENCE TO RELATED APPLICATIONS

This application is a continuation-in-part of U.S. patent application Ser. No. 08/236,202 filed Apr. 28, 1994.

FIELD OF THE INVENTION

The present invention is directed to submicrometer feature placement metrology, for verifying patterns used in fabrication of semiconductor integrated circuits and the like. More particularly, the invention relates to novel standards and methods for measuring "overlay" as experienced in semiconductor manufacture, and for calibrating imaging equipment used in fabrication of semiconductors (including both optical microscopes and electron microscopes) so as to avoid certain classes of errors inherent to known overlay imaging metrologies.

BACKGROUND OF THE INVENTION

As is well known, semiconductor manufacturing processes, as used to manufacture integrated circuits (ICs), involve a succession of fabrication operations requiring accurate registration of the tools used in each operation with respect to the semiconductor wafer being processed. More specifically, successful semiconductor manufacturing requires highly accurate alignment of features on masks used in photolithographic processes, and of their projection onto the wafer, such that successive mask-defined patterns of material are located on the wafer with accuracy in the low tens of nanometers range.

One important class of applications of the invention involves the mapping of the local "overlay" in this context, the relative location of features formed in different steps in an IC wafer fabrication process. The "overlay" is a vector quantity defined at every location on the substrate as the difference between the vector position $P_1$ of (for example) a first-formed portion of a conductive structure on a substrate with respect to an arbitrary reference point, and the vector position of the corresponding point $P_2$ in a second-formed portion of the structure. In the common circumstance where the first and second portions are to be directly aligned, the overlay is zero where $P_1=P_2$, i.e., when the composite pattern is formed correctly.

It will be appreciated that overlay may thus occur in orthogonal x and y dimensions. For example, suppose an underlying conductive "trace" extending in the x direction is to be connected to an overlying trace extending in the y direction by a connecting "post" filling a through-hole or "via" formed in an intervening insulative layer. If the via is displaced in the y direction from its proper location, the connecting post will be off-center with respect to the underlying conductor, and may fail entirely to make adequate contact thereto. However, this overlay in the y-dimension may not affect the contact between the post and the orthogonal upper conductive trace. Accordingly, reference herein to overlay measured with respect to differing layers of a multiple-layer structure should be understood to include overlay of connecting elements formed in vias with respect to associated conductors, as well as overlay of the conductors per se.

For example, patterning overlay errors result when the features formed on a substrate in a second image-transfer operation are not properly located relative to features having been formed thereon in a prior operation, or when a feature is improperly located with respect to other features formed in the same imaging operation. Stated slightly differently, overlay may derive from the misalignment of images formed sequentially by the image-transfer tooling, e.g., when two or more masks are used in sequential photolithography operations to form a resulting composite pattern on the substrate, and may also result from errors or defects in one or more of the masks, e.g., improper placement of features on the masks.

The parent application, Ser. No. 08/236,202 and the application from which it claims priority (now U.S. Pat. No. 5,383,136) disclose methods and test structures useful in measuring overlay, all involving measurement of voltage drops between sections of a composite structure responsive to a current being forced therethrough. More specifically, in the grandparent application Ser. No. 07/852,439, now U.S. Pat. No. 5,383,136, a quantity "x" referred to as the "offset" was defined to be the displacement of the center tap of a potentiometer formed on a substrate in a second image-transfer operation from the midpoint between the two end taps of the potentiometer formed thereon in a prior image-transfer operation. When the offset x was zero, the composite pattern was defined to have zero-overlay. Thus the offset x measured using the potentiometer in many cases corresponded to the overlay 0 of the overlaying patterns forming the composite pattern, that is, when the overlay 0 was due entirely to the offset x. While for such potentiometers the offset x of an individual potentiometer may or may not be defined to be the same as the overlay 0 of the composite pattern, the difference between the values of x and 0 for individual composite patterns will be the same in foreseeable applications.

It is common practice in the prior art to use imaging instruments (including optical and electron microscopes, for example, in the term "imaging instruments" as used herein) to monitor various aspects of semiconductor manufacturing operations, including overlay. For example, optical instruments may be used in conjunction with substrates having a known reference grid pattern printed thereon to evaluate whether a stepper moving an optical tool across the substrate is in fact doing so accurately. It is also known to use a so-called "golden substrate" similarly having a known reference grid pattern printed thereon, and then to pattern this with a second layer of a separate material and optically measure whether the second layer of material is accurately located with respect to the grid on the golden substrate. In both cases, the accuracy of these imaging instrument measurements may be compromised by so-called "tool-induced shift" and/or "wafer-induced shift".

Generally speaking, tool-induced shift ("TIS") arises from misalignment of the imaging instrument and contributes a constant amount to the measurement of overlay (that is, misalignment of two or more separately formed features) independent of the properties of the target features. Wafer-induced shift ("WIS") arises from asymmetries in the formation of the target features that are inspected with the imaging instrument. For example, a conductive "feature" which is to be located using an imaging instrument may in theory have vertical sides meeting a flat upper surface at square corners. However, the process used to form the conductor may be such that the sides of the conductor are not parallel to one another, and thus may not meet the top of the conductor at right angles. Using an imaging instrument to measure the width of the feature, or the spacing of adjacent features formed in successive imaging operations, will result in unpredictable errors; as the severity of these errors varies with the process used to form the structure being measured, such errors are referred to as wafer-induced shift. As noted, WIS is process-dependent and varies somewhat unpredictably from one type of manufacturing process to another, although a given manufacturing process typically exhibits fairly consistent WIS.

Typically, the effects of TIS on measurements of a particular structure on a substrate can be eliminated by 180 degree rotation of the substrate about the optical axis of the instrument and averaging the measurements made with respect to the structure. While this process is generally workable, it is not popular because it requires substantial additional effort and time. WIS, however, cannot be conveniently estimated, can amount to 50 nanometers or more, can affect the impact of TIS on any given measurement, and is highly process-dependent.

Therefore, it can be seen that there is a distinct need for a method for evaluating TIS of an imaging instrument, and for evaluating WIS as measured by an imaging instrument with respect to structures formed using a particular processing sequence.

Electrical measurements, such as the voltage-drop measurements described in the predecessor applications, do not suffer from TIS; to the extent electrical measurements suffer from an electrical analog of WIS, its effect is much smaller than that exhibited by optical measurements, and in many cases can be substantially minimized, as described in the predecessor applications. Accordingly, it would be desirable to provide a test structure having features detectable by imaging instruments, and certified by electrical measurement, which could then be supplied to manufacturers or inspectors of products for calibration of imaging instruments. That is, it would be desirable to provide a structure manufactured, and tested electrically, to certify the relation of a plurality of features visible using an imaging instrument to be calibrated, this information being then provided to the user of the imaging instrument. The imaging instrument could then be calibrated accordingly. It would be further desirable to provide an electrically-testable structure which entirely eliminated any electrical analog of WIS.

OBJECTS OF THE INVENTION

It is therefore an object of the invention to provide a test structure and method for calibrating imaging instruments used for measuring the location of features on a substrate, in particular, as used for overlay measurement, such that tool-induced shift and wafer-induced shift in such measurements can be correctly compensated for.

It is a further object of the invention to provide a method for correlating electrical measurements of the relative location of features on a substrate with measurements thereof made using imaging instruments, in order to calibrate such instruments.

It is a further object of the invention to provide a method whereby electrical measurements of locations of objects on a substrate can be made using non-contact electrostatic and/or electromagnetic techniques, such that features not involving direct electrical contact between plural conductive members, e.g., non-conductive and/or insulating features, can be effectively located, and such that these measurements can be used to calibrate imaging instruments.

It is therefore an object of the invention to provide a method and a test structure whereby a test structure can be certified electrically and used subsequently to calibrate imaging instrumentation, including both optical microscopes and electron microscopes and the like.

It is a further object of the invention to provide a test structure and method for determining when such a structure, or one of a series of test elements comprised thereby, is formed with zero (or minimal) overlay.

SUMMARY OF THE INVENTION

As noted, measurements made with imaging instruments, again including both optical microscopes and electron microscopes, suffer from a number of deficiencies which are addressed by the present invention. For example, if an optical microscope is not aligned precisely with the object being inspected, a systematic tool-induced error or shift ("TIS") will be introduced into all measurements made thereby. Furthermore, suppose the spacing of two conductive lines is to be measured. Such conductors ideally form rectangles in cross-section but in practice may be generally irregularly trapezoidal, i.e., the side walls of the conductors may not be perpendicular to the substrate, or may be substantially asymmetrical. Furthermore, conductors formed in differing operations may exhibit differing asymmetries. Measurements made using imaging instruments to locate such conductors exhibit substantially unpredictable errors, referred to as wafer-induced shift ("WIS"). WIS contributes error to measurements of the relative locations of conductors made using imaging instruments.

Electrical measurements, by comparison, are not susceptible to TIS, and, in general, can be designed to substantially minimize WIS. Accordingly, it would be desirable to provide a test structure having features the locations of which are "readable" by imaging instruments, and certifiable by electrical measurement, which could then be supplied to manufacturers, users, or inspectors of products for calibration of imaging instruments. Such a structure could be manufactured and tested electrically to certify the relation of a plurality of optically-readable features, and this information then provided to the individual or organization using the imaging instrument, for calibration of the imaging instrument.

According to the present invention, a hybrid structure, "hybrid" in the sense that the structure defines features that can be detected using both imaging and electrical instruments, is provided. In one embodiment, first and second patterned layers of material are formed in succession on a substrate, each defining reference indicia that can be read optically; the remainder of the structure formed by each of the two layers bears a specified spatial relationship to the respective reference indicia, and forms features that can be examined electrically to identify a null-overlay structure, or a null-overlay portion of a composite structure. Such null-overlay electrical measurements provide an objective indication of the actual alignment of the two layers, while measurements of the relationship of the reference indicia made using the imaging instrument include TIS and WIS. A comparison of these two sets of observations can be used to calibrate the optical instrument for subsequent measurements. The null-overlay structure can also be combined with the test structures shown in the predecessor applications, for calibration thereof.

In an example of provision of a test structure for calibrating an imaging instrument, a first conductive pattern is deposited on a substrate. The first pattern includes reference members for detection by an imaging instrument and defines a number of test points in a known spatial relationship to the reference members. A second patterned layer of a second conductive material is then formed overlying the first conductive layer. Typically, the second patterned conductive layer is formed by deposition of conductive material over a patterned insulative layer overlying the first conductive layer, such that the locations of various features in the pattern of the second conductive layer are determined by features in the insulative layer, which thus defines the overlay. The insulative layer defines reference marks and a number of features for electrically connecting the first conductive layer and the second conductive layer. The connecting features are spaced progressively further from a baseline aligned with the reference marks, such that each feature exhibits different overlay. The feature exhibiting minimum overlay with respect to the corresponding test point, ideally zero overlay, is identified electrically. A measurement of the location of the reference marks with respect to the reference members is made using the imaging instrument to be calibrated. The imaging instrument is calibrated using the electrical identification of the minimum overlay feature, eliminating TIS and WIS from subsequent comparable measurements of overlay made using the imaging instrument.

More specifically, a substrate is provided at each of a number of sites with multiple instances of a composite pattern suitable for separate evaluation of overlay by imaging instruments and by electrical measurement. In a specific example, a first component of each composite pattern comprises reference members which enable an imaging instrument to determine their placement relative to the instrument's coordinate reference frame, e.g., a pair of extended parallel lines of a first conductive layer, having width and spacing consistent with those of frame-in-frame targets commonly used for optical overlay metrology in semiconductor-wafer processing. Copies of the first component of the composite pattern are formed at multiple locations on the substrate using a stepper device to move a tool, e.g., a photolithographic mask, between the locations. A number of copies of a second component of the composite pattern, each defining reference marks, are then deposited on the substrate at each location of the first component, such that each instance of the first component and a complementary instance of the second component are located in a common region of the substrate. The result is that an instance of a composite multiple-layer pattern is replicated at each common region, wherein each instance of the composite pattern is defined by the superposition of a first component and a second component. The second component may be imaged from a second mask and replicated on the substrate by the same stepper device, operating with the same exposure-site step-and-repeat parameters.

Each instance of the composite pattern has a unique overlay value represented by the position of its reference members relative to its reference marks. Thus, the reference marks and reference members of each composite pattern together constitute a "target" from which an imaging instrument can estimate the overlay with which the composite pattern at each common region was fabricated.

In order to provide a comparable electrical indication of the overlay, each of the composite patterns at every site on the substrate includes a number of designed-in zero-overlay detection features, each comprising a series of test structure elements each having varying designed-in overlay contributions in addition to the overlay with which each structure is actually fabricated, that is, in addition to any overall site overlay of the pattern at each location. The designed-in Zero-overlay detection features may be provided by varying the relative position of components of the test structure elements from an arbitrary reference point. For example, conductive members connecting upper and lower conductors of each element may be linearly progressively displaced relative to a baseline. Thus, the overlay values characterizing the set of elements at each site constitute a linear series. Each element's actual overlay is the sum of the site overlay, that is, the overlay with which the entire composite pattern was replicated at that site, and the designed-in overlay for that particular element. Site overlay is in practice a random variable, but is the same for all structures at a particular site. According to the invention, the designed-in overlay contributions to the actual overlay vary in a known fashion from element to element, so that plural electrical measurements can be compared to identify a zero-overlay feature and thus to evaluate the site overlay.

As noted, the composite structures include plural test structure elements having geometries enabling zero-overlay detection; for example, zero-overlay detection features of each element may be placed linearly progressively further from a base line. If the baseline is fixed with respect to reference marks that can be imaged using an imaging instrument, that instrument can thus be calibrated. Electrical, electromagnetic, or electrostatic testing can be performed with respect to each element to determine which, if any, of the elements at a given site is characterized by zero actual overlay, or to determine which exhibits minimal overlay. (For the purposes of conceptual definition, a structure exhibits zero actual overlay when a hypothetical ultraprecise imaging instrument having no TIS or WIS error records zero overlay on examining the targets formed by the reference members and the reference marks.) Where none of the composite test structure elements at an exposure site happens to be fabricated with zero actual overlay, as a consequence of the random site overlay contribution, the linearly progressive placements of the zero-overlay detection features enable the estimation of a zero-overlay detector index, characterizing the composite structures at each substrate site. The values of the zero-overlay detection indices in conjunction with the linear progression of the designed-in overlay, and accordingly, the set of overlays measured by the imaging instrument at a particular site, enables determination of the sum of WIS and TIS for the measurements at that respective site.

If the first and second layers are conductive, such that features of the second component of the pattern are to be in electrical contact with test points defined by the first component, the overlay can be measured by evaluating the resistance therebetween. Electrical identification of a "zero-overlay" feature best aligned with the underlying structure can be accomplished by forcing a current between each of the test points and the underlying conductive structure, and measuring the resistance of each of the connections. If the second layer is non-conductive or is to be spaced from the first by a dielectric insulative layer, or if a non-contact technique is desired, a suitable signal can be impressed on a probe brought into close juxtaposition to the structure and moved therealong, while measuring the capacitance, inductance, or impedance between this probe and the substrate. Variations in the signal measured between the probe and the substrate can be detected responsive to the presence of varying amounts of conductive and dielectric material therebetween; for example, when conductive members of the various layers line up, the local capacitance will exhibit an extreme value.

According to another aspect of the invention, "tool-wide" errors, such as errors resulting from misalignment of photolithographic "masks" used in successive patterning operations, and "local" errors, such as misplacement of a feature within a mask, which together contribute to the overlay measured, can be distinguished from one another. A number of test structures of essentially identical configuration are formed on a single substrate, in a process wherein different portions of the test structure are applied at different manufacturing steps. Analysis of overlay measured with respect to each of the test structures can be carried out to differentiate, for example, the contributions of mask misalignment errors and mask patterning errors to the total overlay, while random variations in, e.g., conductor segment length measurements due to contamination or the like are effectively removed from the results.

According to another aspect of the invention, several different designs for test structure elements are provided. The test structure elements are reproduced with linearly varying designed-in overlay to form test structures useful in evaluating overlay. An electrical characteristic of each element is evaluated in order to identify a particular composite element having zero or minimal overlay. Furthermore, particular ones of these elements can be combined with the test structures, e.g., as described in parent application Ser. No. 08/236,202, and its parent application, now U.S. Pat. No. 5,383,136, to correct for a particular effect noted therein.

BRIEF DESCRIPTION OF THE DRAWINGS

The invention will become more readily understood if reference is made to the accompanying drawings, in which:

FIGS. 4(a)–(e) are cross-sectional views illustrating the effect of increasing overlay;

FIG. 7 is a graph illustrating calibration of an optical instrument with respect to a reference substrate according to the invention;

FIG. 8 shows envisioned data graphed in FIG. 7 in tabular form;

FIG. 9 shows the variation in capacitance measured between a substrate and a scanning probe, as a function of the position of the scanning probe with respect to a structure shown in cross-section;

FIG. 10 shows one arrangement for making non-contact electrostatic measurements according to the invention;

FIGS. 11–14 show different types of test structure elements which may be employed for null overlay measurements, for example, as part of the overall structure shown by FIGS. 5 and 6;

FIG. 15 shows a modification of the test structure shown in parent application Ser. No. 08/236,202 to incorporate null overlay detection according to the present invention; and FIG. 16 compares envisioned measurements for contact resistance, as measured (for example) using the test structure element of FIG. 11 at a number of locations in the overall structure of FIG. 5, and a graph of a quantity characterized mathematically in Ser. No. 08/236,202, both shown as functions of positions of respective test structure elements in a composite test structure.

DESCRIPTION OF THE PREFERRED EMBODIMENTS

Figure 1:
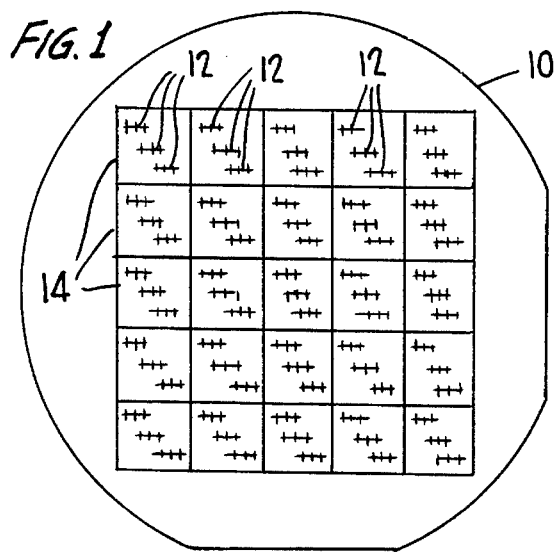
FIG. 1 illustrates a typical semiconductor wafer having a number of test structures according to the invention formed at plural exposure sites thereon.
Figure 1B:
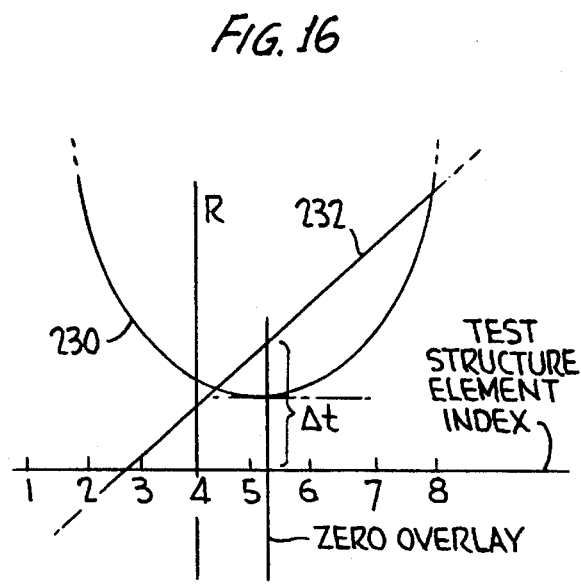
Figure 5:
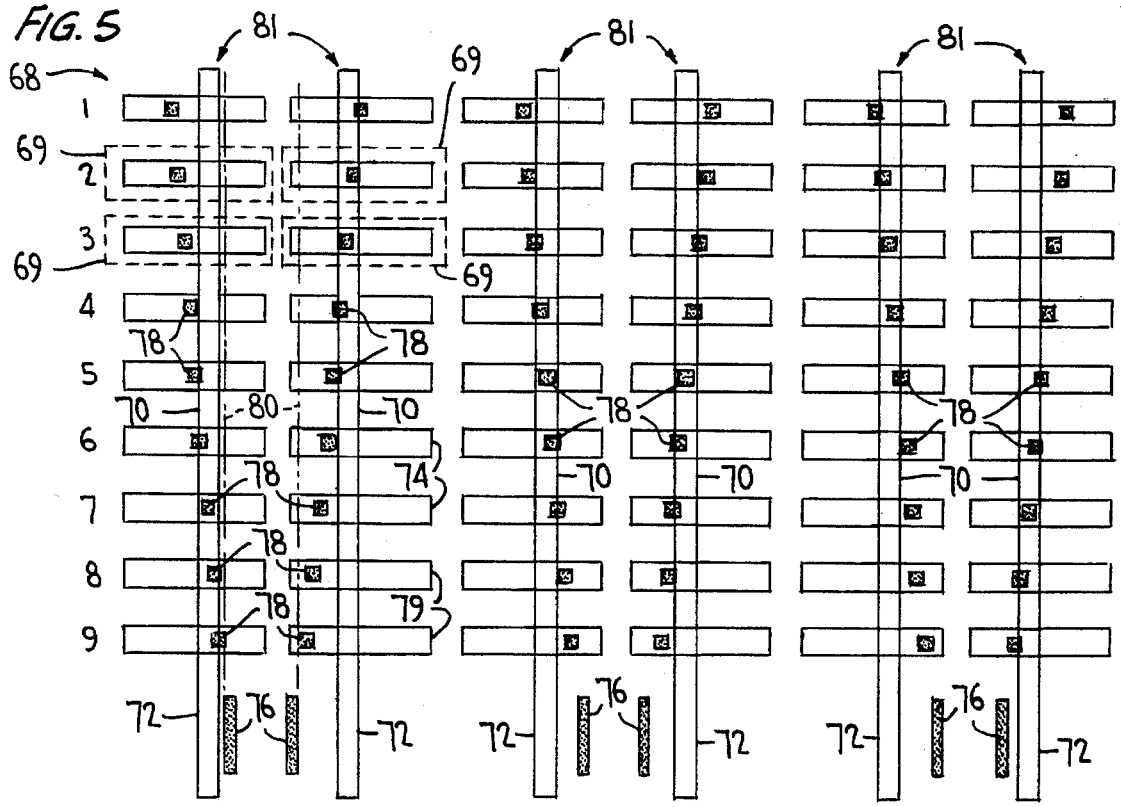
FIG. 5 shows a composite test structure according to the invention exhibiting zero overlay.
Figure 6:
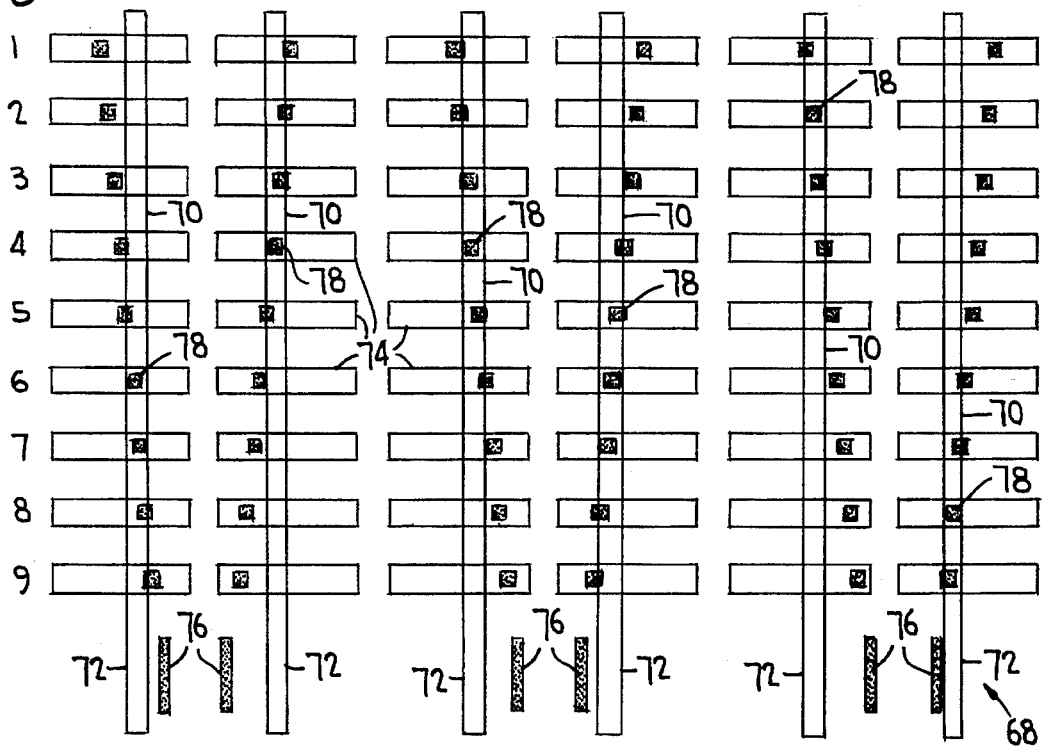
FIG. 6 shows a composite test structure comparable to that of FIG. 5 but with non-zero overlay.

FIG. 1 shows an exemplary layout for an integrated circuit wafer 10 employing composite test structures 12 according to one aspect of the invention at each of twenty-five "exposure sites" 14. In this example, twenty-five nominally identical integrated circuit "chips" are to be formed on wafer 10, one at each exposure site 14; three identical composite test structures 12 are formed simultaneously, at each of the twenty-five exposure sites 14, in order to obtain further advantages provided by the method and test structure of the invention. Such composite test structures 12 may be as shown in FIGS. 5 and 6 and discussed in detail below. Alternatively, structures 12 may be composed of patterns generally as shown schematically in FIGS. 2(a)–(c), which may incorporate test structure elements as shown in one of FIGS. 11–14, in test structures shown in FIGS. 5, 6, and 15.

The present discussion of FIGS. 1 and 2(a)–2(c) is essentially common to the parent application, and is repeated here to illustrate the comparison of a number of test structures formed simultaneously at each of a number of chip sites 14 on a wafer 10 to discriminate, e.g., tool fabrication errors from tool location errors. According to the invention of the present continuation-inpart application, the test structures shown in FIGS. 2(a)–(c), or the test structures of FIGS. 5 and 6, can also be employed to calibrate an imaging instrument, and may be disposed at numerous locations across a substrate in order to differentiate various sorts of error.

Figure 2A:
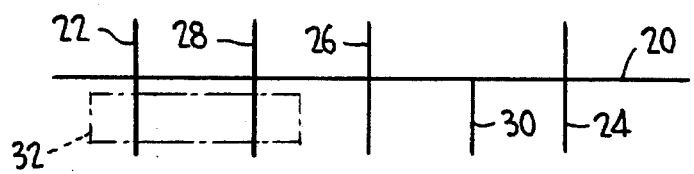
FIG. 2(a)–(c) illustrate test structures according to the invention and depict the manner in which differing types of error may occur.
Figure 2B:
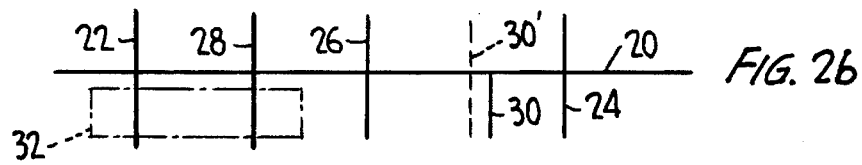
Figure 2C:
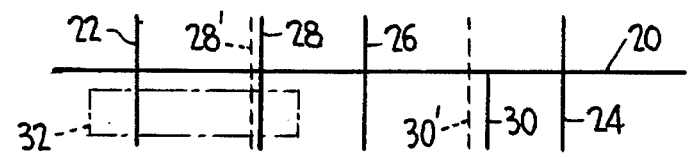

FIGS. 2(a)–2(c) show, respectively, schematic views of an exemplary test structure as designed, an erroneous test structure as might result from a mask-pattern generation or "local" error, and a further erroneous test structure as might result from a mask-misalignment or "tool-wide" error between first and second patterning operations.

More specifically, FIG. 2(a) shows an exemplary desired test structure manufactured correctly, that is, according to its design, without "local" pattern generation errors or "tool-wide" mask misalignment errors. The test structure comprises an electrically-conducting bridge conductor 20 formed together with taps 22, 24, and 26 in a single patterning operation, such that under normal circumstances the taps are very precisely located with respect to one another. In a subsequent patterning operation, a further crossing tap 28 and a tap 30 are added, such that FIG. 2(a) shows the taps 28 and 30 in their intended positions. Preferably such a test structure will be formed incorporating certain improvements discussed in detail in parent application Ser. No. 08/236,202, in particular the employment of "dummy taps" (not shown) to correct for the effect of the presence of voltage-measuring taps on the measured lengths of conductive segments thereof.

If it is assumed that the portion of the mask (or other tool) used for the second patterning operation exhibits a local error, such that the mask section employed to form tap 30 is displaced, the test structure shown in FIG. 2(b) might result, i.e., wherein the tap 30 is displaced from its intended position indicated by dashed line 30'. This error will be detected by observation of the 'offset' of tap 30; comparison of voltage drops between, for example, pairs of taps 26 and 30, and 24 and 30, will exhibit the displacement of tap 30 from its desired position 30'.

By comparison, if the entire mask used in the second patterning operation to form taps 28 and 30 is misaligned with respect to the previously formed portion of the test structure comprising bridge conductor 20 and taps 22, 24, and 26, the erroneous test structure shown in FIG. 2(*c*) might result, i.e., wherein tap 28 is displaced from its design position 28' and tap 30 is also displaced from its design position 30'. If the mask is used in a single step to form structures over the entire exposure site 14, as is usual, the misalignment error will occur over the entire exposure site, i.e., a common "tool-wide" error will appear in all features formed at a particular exposure site 14 in a given exposure using the misaligned tool. Conversely, local errors as might result from errors in the mask pattern will generally occur to the same extent at corresponding locations at all exposure sites.

According to one aspect of the invention disclosed in the parent application, such tool-wide and local errors can be distinguished by proper analysis of overlay measurement. The offsets exhibited by the test structure exhibiting local errors as exemplified by the pattern of FIG. 2(*b*) and the test structure exhibiting tool-wide errors with FIG. 2(*c*) are distinguishable from one another according to another aspect of the invention, such that the corresponding faults in the manufacturing process can be identified and addressed.

According to another important aspect of the invention, the test structures of FIGS. 2(*a*)–(*c*) can also be inspected by imaging instruments, by providing portions of the structure which can be measured by imaging instruments in known physical relation to portions of the structure that can be tested by electrical measurement. For example, parallel portions of taps 22 and 28 comprise a portion of a conventional "bars-in-bars" overlay test pattern, as indicated at 32. A measurement of the spacing of taps 22 and 28 can be made using an imaging instrument; according to the invention, this measurement, which will be susceptible to TIS and WIS, in addition to tool-wide errors and local errors, as discussed above, can then be calibrated with reference to an electrical measurement of the spacing of the taps 22 and 28.

As shown in FIG. 1, according to this aspect of the invention, a number of substantially identical test structures indicated generally at 12 may be formed at each of a number of exposure sites 14 on an integrated circuit wafer 10, i.e., as part of a full-scale manufacturing process, or as part of a prototype process or the like. It will be appreciated by those of skill in the art that normally the area of the wafer 10 occupied by the test structures 12 will be much smaller; the test structures are shown at large scale in FIG. 1 to enable their illustration.

In the example of FIG. 1, twenty-five groups of three nominally identical test structures 12 are provided, one group at each exposure site 14. The test structures 12 may be as discussed above, e.g., in connection with FIGS. 2(*a*)–(*c*), or may be as discussed below in connection with the composite structures of FIGS. 5 and 6, or otherwise. According to this aspect of the invention, however, the estimated overlay $O'_{ij}$ of a particular test structure j at exposure site i formed in differing manufacturing operations is measured with respect to each of the test structures 12, and is used as the input to a process whereby the least-squares sum S of the measured overlays $O'_{ij}$ is calculated to determine values for tool-wide mask misalignment errors $M_i$ and local pattern errors $P_j$ at each location.

More specifically, for a substrate having $N_s$ total sites, each having $N_p$ test structures (e.g., where 3 test structures are formed at each of 25 locations, $N_s=25$ and $N_p=3$, such that 75 total structures are formed) the contributions of "tool-wide" misalignment $M_i$ and of "local" tool fabrication errors $P_j$ are defined to be those which minimize the quantity S, as follows:

$$S = \sum_{i=1}^{N_s} \sum_{j=1}^{N_p} (O'_{ij} - M_i - P_j)^2$$

where $O'_{ij}$ is the overlay measured with respect to the structure identified by i and j, i.e., the j-th structure at the i-th exposure site.

If the sum S of the squares of the errors according to this equation is minimized by selecting appropriate values for the actual tool-wide misalignment contributions $M_i$ and local errors $P_j$, the tool-wide misalignment contributions $M_i$ and local pattern error contributions $P_j$ to the $O'_{ij}$ as measured provide values $O_{ij}$, where $O_{ij}=M_i+P_j$, for the actual overlay of each structure. In this analysis, the total overlay $O'_{ij}$ measured with respect to any particular test structure 12 is the sum of the contribution $M_i$ due to misalignment of a tool used in a subsequent patterning operation with respect to a structure formed in a prior patterning operation, and the contribution $P_j$ of errors in the individual tool with respect to other portions of the individual tool plus a residual error, usually random in nature.

According to an important aspect of the invention, the same tool is used to form a portion of the test structure added to previously-formed portions of test structures at each of a plurality of test structure locations, such as exposure sites 14, so that the local error $P_j$ is systematic, appearing at the same respective location in a plurality of sets of test structures. This enables the least squares analysis discussed above to separate out tool-wide errors $M_i$ from local pattern manufacturing errors $P_j$.

Stated more generally, the $M_i$ contributions to $O'_{ij}$ for all test structures formed in a single operation, i.e., at a given exposure site 14, are tool-wide: that is, the overlay $O'_{ij}$ measured with respect to each test structure completed in a particular two-step operation at a particular exposure site will exhibit the same contribution $M_i$ due to a misregistration of the tool used for the subsequent operation with respect to a structure formed in the previous operation. The $P_j$ contribution to $O'_{ij}$ is "local"; that is, if a portion of the tool is manufactured improperly, such that a particular feature is displaced with respect to the remainder of the tool used in the second operation, that error will affect the corresponding test structure at each chip site where that tool is used. Further details of this analysis are provided in parent application Ser. No. 08/236,202, incorporated herein by reference. Those of skill in the art will recognize that provisions for magnification error and relative rotation error might also be incorporated into the statistical analysis.

As mentioned previously, according to an important aspect of the present invention, imaging instruments for overlay measurement are calibrated by reference to measurements made electrically. "Imaging instruments" as used herein refers to optical microscopes, electron microscopes, or the like, which effectively measure, for example, the relative spacing between features on a structure, the width of features, or the like, by detecting reflection of radiation from, or contrasts in transmission of radiation through, the features on a test structure. "Electrically" as used herein refers to contact measurement techniques, such as measurement of resistance responsive to a current forced through conductive structures, and also to non-contact techniques, such as electrostatic or electromagnetic techniques. As indicated above, these imaging instruments are known to be subject to systematic errors called "shift" including so-called "tool-induced shift" typically referring to misalignment of the measuring tool, and "wafer-induced shift" as may be caused by certain characteristics of the pattern under inspection. Tool-induced shift ("TIS") is typically estimated by repeating measurements after reorientation of the substrate being inspected, while wafer-induced shift ("WIS") is estimated as part of a calibration exercise involving patterns having known overlay.

By comparison, electrical overlay metrology as described in the parent application, that is, using electrical measurements carried out on test structures, is fast and inexpensive and can be very effective in process evaluation, and does not suffer from any equivalent to the TIS common to imaging metrology, while the effects of an analog to WIS on electrical measurements identified in the parent application can be rendered very small. According to one aspect of the present invention, the electrical analog to WIS can be eliminated entirely.

Further according to the present invention, different electrical measurement techniques may be employed depending on the materials involved; for example, if the electrical test structure is formed of several electrically-conductive materials, a technique involving measurement of the resistance between adjacent members may be employed. If the structures of interest are formed of photoresist, oxide layers, and like nonconductive materials, capacitative or inductive techniques responsive to the presence of dielectric materials may be employed.

More specifically, "TIS" in many circumstances is due to misalignment of the optical axis of the imaging instrument. Consider the problem of measuring the spacing between centerlines of features on a substrate using an optical microscope whose optical axis is not aligned perpendicularly to the substrate. As the distance of the feature off-axis increases, the measurement may be subject to increasing TIS errors. While such tool-induced shifts can be averaged out of feature placement measurements by rotating the substrate through 180 degrees and remeasuring the same spacings, thus cancelling the error, this process is cumbersome, and requires essentially duplicate effort. It would be preferable to provide a reference structure which could be used to calibrate the imaging instrument so that subsequent measurements could be corrected for such tool-induced shift.

Figure 3A:
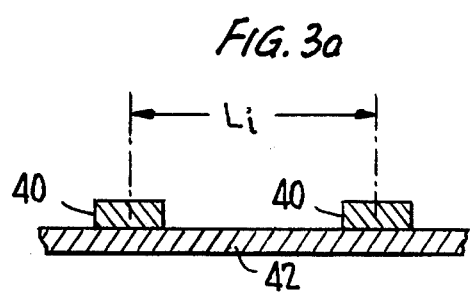
FIGS. 3(a) and (b) are cross-sectional views through conductive members on a substrate.
Figure 3B:
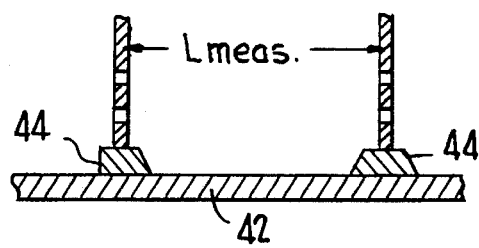

Wafer-induced shift ("WIS"), on the other hand, tends to be a function of the particular process used to form the structure. FIGS. 3(a) and 3(b) provide an example of one source of wafer-induced shift. In FIG. 3(a), a pair of features 40 are formed on a substrate 42. In the ideal case shown in FIG. 3(a), features 40 are perfectly rectangular in cross-section, and are spaced by distance $L_i$, usually measured center-to-center, as shown. FIG. 3(b) shows a more typical case, wherein the actual cross-sections of the features are differently asymmetrical trapezoids as shown at 44. In this case the spacing $L_{meas}$ of the features 44 is uncertain, depending on the extent to which the side walls of the features 44 contribute to the location of the apparent centerlines; this is a complex function of the illumination employed, the reflectivity of the side walls, and so on. Spacing of features as thus measured (for example) are thus uncertain to a degree referred to as wafer-induced shift ("WIS").

It would clearly be desirable to provide a certified test structure for users of imaging tools, which would provide calibration for TIS and WIS; preferably, such a tool would be fabricated using the same process techniques as that used to form the objects to be thus imaged. In one possible implementation of this aspect of the invention, a substrate having a first patterned layer formed thereon would be supplied together with a design for a second patterned layer to the semiconductor manufacturer, who would then apply the second layer, e.g., features 44 in FIG. 3(b), at the same time as the devices to be thus imaged were being manufactured. This would ensure that the features on the reference tool displayed the same asymmetries and the like, i.e., the same WIS, as the structures of direct interest, i.e., the devices being manufactured. The actual location of the features would then be measured electrically, in a process not subject to TIS.

Comparison of the electric and imaging instrument measurements allows the total shift, i.e., the sum of TIS and WIS, as measured by imaging instruments, to be accurately evaluated. According to the present invention, the electrical measurement can also be performed in a manner eliminating the electrical analog to WIS discussed in the predecessor applications. In any event, WIS is normally small in electrical measurements as compared to optical measurements, such that WIS is essentially eliminated from the latter by calibration using electrical techniques as described herein. Measurements made using the imaging instrument can then be calibrated accordingly and used subsequently to inspect accurately products being manufactured.

FIGS. 4(a)–(e) provide an example of multiple-layer structures exhibiting differing degrees of overlay, which are difficult to evaluate using imaging tools as presently available. More specifically, FIGS. 4(a)–(e) each show cross-sectional views of a multiple-layer structure formed on an insulating film 50 on a substrate, such as a silicon wafer or the like, as conventionally employed. FIGS. 4(a)–(e) show the structure formed with increasing rightward overlay of features patterned in an overlying insulative layer 54 relative to underlying features 52, 52', 52". A series of patterned conductive elements indicated at 52, 52', 52", 52''' are provided in a first operation; these each appear at the same respective position in each of FIGS. 4(a)–(e), inasmuch as they are formed using a single photolithographic mask or other unitary tooling, such that their respective positions are fixed. In a subsequent operation, an overlying insulative layer 54 is formed and is then patterned as indicated at 56, 58, and 60 to define vias extending down either to the substrate 50 or to expose the conductive members 52, 52', 52", 52''', depending on the location of the vias thus formed.

As can be appreciated by inspection of FIGS. 4(a)–(e), the relationship of vias 56, 58, and 60 is fixed, as these are also formed using a single photolithographic mask or the equivalent. However, the relation of vias 56, 58, and 60 to conductors 52, 52', 52", 52''' varies depending on the degree of accuracy of registration of the mask used to form vias 56, 58 and 60 with respect to the underlying conductors, that is, depending on the overlay. If a conductive member 62 is subsequently formed in via 60, the quality of alignment of via 60 with respect to conductor 52" can be monitored electrically. For example, if a current is forced between the conductive member 62 and the underlying member 52", as indicated schematically at 63, the resistance measured therebetween corresponds directly to the quality of alignment thereof. Thus the FIG. 4(b) structure, being better aligned, will generally exhibit less resistance between conductors 62 and 52" than, for example, the FIG. 4(e) structure. The quality of the overlay of each pattern can thus be monitored electrically, and a zero- or minimal-overlay feature (such as in FIG. 4(c)) identified.

Tools for making a comparable optical measurement of the overlay—that is, detecting the precise location of via 60 with respect to the underlying conductor 52"—are not now available. Typically, optical tools are used to estimate overlay of a pair of members formed in the same step as vias 56 and 58 relative to a pair of members formed in the same step as conductive features 52 and 52''', such that these pairs of members jointly constitute a standard frame-in-frame target. Such overlay estimates are subject to TIS and WIS errors. It is an object of the invention as mentioned above to provide test structures allowing direct comparison of imaging-instrument and electrical evaluations of the overlay of a given structure, so that the imaging instrument can be calibrated.

In one embodiment of test structures implementing this aspect of the invention, a first set of plural "reference marks" which can be detected by an imaging instrument are provided in fixed spatial relationship to the vias used to form conductive structures in a number of test structure elements, and a second set of "reference members" also detectable by the imaging instrument are provided in fixed relation to underlying conductors. Imaging-instrument measurements of the relative positions of the reference marks and reference members are calibrated by comparison to corresponding electrical measurements identifying a zero-overlay test structure element. The calibrated imaging-instrument measurements are used thereafter for monitoring the accuracy of structures formed in comparable processes.

FIGS. 5 and 6 show examples of composite test structures 68, each including a number of test structure elements 69 organized as columnar test structures 81, in this case paired. The series of test structure elements 69 of each test structure 81 exhibit linearly-varying designed-in overlay. By identifying the test structure element 69 exhibiting minimal overlay, ideally null or zero overlay, objective information concerning the physical relationship of the components of the structure may be provided; this information in turn allows calibration of imaging instruments using electrical techniques as discussed above. The composite structures 68 of FIG. 5 and 6 are nominally identical, except that the composite structure of FIG. 5 exhibits zero overlay, while that of FIG. 6 exhibits overall (i.e., rightward) positive overlay, as might occur due to manufacturing variation resulting from a toolwide error. A comparable structure could also be shown exhibiting negative overlay.

The composite test structures 68 in FIGS. 5 and 6 both include six essentially similar but not identical columnar test structures 81, organized as pairs, each in turn comprising nine test structure elements 69. Such composite structures 68 may be disposed at spaced locations, e.g., at 25 exposure sites 14 across a semiconductor substrate 10 as shown in FIG. 1.

Each of the test structures 81 shown in FIGS. 5 and 6 is formed in at least two operations. Normally, a later-formed component is disposed over an earlier-formed component, as in the layered structure of FIG. 4, but an earlier-formed component may also be modified in a later operation. In either case, by measuring the relative location of the components formed in the several operations, an indication of the overlay thereof can be derived. The overlay is of direct interest to the manufacturer of semiconductor products, because the overlay describes the accuracy of registration of features formed in various successive processing steps. A test structure qualified using electrical techniques to characterize the overlay can be used to calibrate an imaging instrument; overlays subsequently measured thereby can be correlated to the actual overlay exhibited on the substrate being inspected.

Each of the structures 81 in this embodiment comprises an elongated conductor 70 including a reference member 72 which is capable of detection by an imaging instrument, e.g., either an optical or electron microscope. Each test structure 81 also includes a number of individual test structure elements 69 formed in successive steps. Specific structures that may be employed for each test structure element 69 are discussed below in connection with FIGS. 11–14. Test structure elements 69 are disposed in numbered rows, one at each of a series of "test points" 74 spaced along the conductors 70. Depending on the specific design selected for the test structure elements 69, test points 74 may simply be arbitrary locations along elongated conductor 70, or may be transverse members, as illustrated. Because the conductor 70 is formed integrally in a single operation with the reference member 72, conductor 70 and the test points 74 therealong are in fixed spatial relation to the reference member 72.

A second portion of each test structure element 69, indicated by crosshatched features 78 shown in FIGS. 5 and 6, is then formed in a second operation. A feature 78 is formed in the vicinity of each test point 74 along the conductor 70; in the same step, a reference mark 76 is formed in the vicinity of the reference members 72. For example, features 78 may correspond to the conductive members 62 of FIGS. 4(a)–(e), that is, features 78 may be connecting members formed in vias in insulative layers. Features 78 are spaced successively greater distances from an arbitrary baseline 80 in fixed spatial relation to the reference marks 76. Accordingly, if an imaging-instrument measurement (providing a conventional "bars-in-bars" or "frame-in-frame" measurement) is made of the relation of the reference marks 76 with respect to the reference members 72, and this is calibrated by an electrical measurement relating the two patterned layers in a manner known to be accurate, subsequent imaging-instrument measurements can be corrected.

The electrical measurement necessary to this process may be accomplished by making successive electrical measurements of the position of the features 78, e.g., with respect to the center lines of respective elongated conductors 70. As indicated above in connection with FIG. 4, if the features 78 are conductive and are in physical juxtaposition with conductor 70 at the test points 74 spaced therealong, resistance measurements can be made therebetween to determine the quality of registration of each of the features 78 with respect to the underlying conductor 70. For example, in the leftmost test structure 81 in FIG. 5, feature 78 of the test structure element 69 in the seventh row of elements 69 is centered with respect to conductor 70. The test structure element 69 of row seven will therefore normally exhibit the minimum resistance, and is accordingly identified as the zero-overlay element for this particular columnar test structure 81. Correlation of this fact with the relation of reference members 72 with respect to the reference marks 76 of this particular columnar test structure 81 as measured using the imaging instrument then allows calibration of the imaging instrument.

It is thus anticipated that each of the composite test structures 68 formed at each of the exposure sites 14 (FIG. 1) will intentionally be formed to comprise left-displaced, centered, and right-displaced pairs of structures 81, as indicated by FIG. 5. The end user will be provided with an indication identifying the feature exhibiting zero overlay of each structure 81, and can use this indication, which is not susceptible to TIS or WIS, to calibrate measurements of the relation of reference indicia 72 and 76 made using his imaging instrument, and therefore subject to TIS and WIS.

It is to be expected that in actual practice all six reference marks 76 and features 78 within one composite structure will be displaced to one side or the other, as indicated in FIG. 6, wherein second-formed features are effectively misregistered to the right of these nominal positions relative to the underlying structures, that is, exhibit positive overlay. Thus providing pluralities of structures 81, and in particular where the features are nominally located successively leftwardly, centrally, and rightwardly of their respective conductors, provides redundancy and also a very clear indication of any misregistration, i.e., tool-wide error, that may be exhibited by the second-formed layer with respect to the first. Further, by providing left-going and right-going successively spaced features, any effect of tool-induced shift (manifested as a leftward or rightward bias in measurements of length, for example) is automatically compensated for in the structure itself.

For further redundancy of measurement, composite test structures exhibiting zero designed-in overlay as in FIG. 5 may be formed at each of a number of exposure sites, together with a like composite structure exhibiting positive overlay, as in FIG. 6, and a comparable composite structure (not shown) exhibiting negative designed-in overlay. By comparing the locations of each of the identified zero- or minimum-overlay features with respect to the corresponding electrical measurements, TIS and WIS can be accurately evaluated.

Summarizing this aspect of the invention, each test structure includes a first-formed patterned component defining at least one reference member and a number of test points in fixed spatial relation thereto. A subsequently-formed patterned component comprises a number of features at successively increasing distances from a baseline in fixed relation to a reference mark. The spacing of the reference members and reference marks is measured using the imaging tool, and the point at which the features of the later-formed component are best aligned with the reference member, that is, with respect to a test point fixed with respect to the reference member, is determined electrically, identifying a zero-overlay test structure element 69. As the electrical measurement does not suffer tool-induced shift or wafer-induced shift as experienced by the imaging instrument, this value can be used to calibrate the imaging instrument, eliminating both TIS and WIS.

In a typical commercial use of the invention, a test structure may be manufactured comprising a substrate and a first patterned layer; a second patterned layer including the features and reference marks is then fabricated using the same process used to form a semiconductor device of interest, that is, using a particular sequence of process steps. The test structure is then characterized electrically, in order to identify the test structure element having zero overlay; this information is then used for calibration of the imaging instruments.

FIG. 8 shows an example of data as might be collected in certification and calibration of a composite test structure according to the invention, as exemplified by FIGS. 5 and 6. The "built-in O/L" data in the first row of FIG. 8 corresponds to the planned overlay of the left-side columnar test structures 81 of each of the three pairs of test structures; i.e., the left-side structure of the left pair of structures of FIG. 5 has a designed-in overlay value of minus 50 nm, while the left-side structure of the center pair of structures has zero designed-in overlay, and that of the right pair is plus 50 nm.

The exemplary "Zero O/L Test Structure Element Index" data in the second row of FIG. 8 corresponds to identification of the null-overlay test structure elements in the left-side structure of each of the three pairs of structures 81 of the composite structure 68 of FIG. 6. This data indicates the row number of the test structure element of the corresponding test structure 81 exhibiting the best alignment, that is, least overlay, with respect to the underlying conductive layer, as identified electrically. The non-integer values shown indicate that interpolation may be needed to properly specify the row of a null-overlay test structure element. In a practical example, the composite test structure would be provided to a user desiring to calibrate an optical instrument together with the tabular data of the first two rows of FIG. 8. The user then makes measurements using his imaging instrument, e.g., an optical microscope, using the "bars-in-bars" structure provided by the reference marks 72 and members 76. He can then calibrate the instrument accordingly for further measurements. Representative optical overlay measurements as might be made by the user are tabulated in the lowest row of FIG. 8, and include both TIS and WIS, as indicated.

The optical overlay and zero overlay test structure element index data (rows 2 and 3 of FIG. 8) can then be charted as shown in FIG. 7. Here, the optical overlay measurements made by the user for each of the three structures (left, center, right) are charted on the vertical axis, versus the number of the corresponding zero-overlay test structure element on the horizontal axis. The optical overlay measurements made by the user may correspond to either the $O'_{ij}$ or $O_{ij}$ values discussed above. As indicated, a line connecting the points for each zero-overlay test structure element intersects the vertical optically-measured overlay axis at a point determining the actual shift, that is, the sum of TIS and WIS. The other contributions to overlay as measured using imaging equipment are identified on FIG. 7.

As indicated, the correction of optical measurements for TIS and WIS can be made using the left-side structure 81 of each pair. The right-side structures can be employed similarly, for redundancy. Further, provision of left- and right-side structures conveniently provides the reference marks and members for bars-in-bars measurements. It will also be appreciated that the same technique can be used in orthogonal dimensions to provide estimates of overlay in both dimensions over the entire extent of a particular substrate.

Where the entire structure, including both first and second layers, is manufactured by a supplier of the test structure, wafer-induced shift is generally correctly measured with respect to a particular fabrication process only insofar as the process used to form the test structure corresponds to that actually used to form the product being manufactured. Therefore it may be desirable for the end-user to form the second layer using the process to be monitored. The test structures according to the invention could likewise be incorporated into exposure sites on regular production wafers, e.g., for quality control purposes.

In this connection, it will be appreciated that according to the invention, information whereby instrumentation can be correctly calibrated with respect to the actual zero-overlay structure is provided. This objective information is of cardinal significance to the manufacturer of production devices, as opposed to provision of abstract values for calibration of optical measurements susceptible to TIS and/or WIS. Such information directly defining the value of the overlay provided according to the invention can be used directly to calibrate the imaging instruments used to manufacture integrated circuit chips.

According to the invention, imaging tools, including optical and electron microscopes, can thus be calibrated if the relative dimensions of features of a reference standard, typically a substrate having a multiple-layer structure formed thereon, can be measured using electrical techniques not susceptible to tool-induced shift and wafer-induced shift, as are the imaging tools. In the above, the electrical measurements contemplated have been described principally as measurements of resistance between conductive members formed in successive steps, such that the resistance measured increases with misregistration of successively-formed components of the overall structure. Techniques of this general type are well known in the art, as described in parent application Ser. No. 08/236,202, and grandparent application Ser. No. 07/852,439, now U.S. Pat. No. 5,383,136 (certain further improvements on the techniques disclosed therein also being discussed below). It is also within the contemplation of the present invention to provide electrical measurements of overlay, that is, of the accuracy of registration of multiple-component structures in classes of structures not involving electrical contact between conductive members, such that resistance measurements are not effective to measure their quality of registration. Such "non-resistance" electrical measurement techniques would be useful in monitoring various processes where dielectric or insulative materials are deposited; in particular, the accuracy of masks and the like used to form such non-conductive layers is of interest.

In a particularly preferred embodiment of the invention, capacitative techniques may be used to locate structures, and such measurements used to calibrate imaging tools. FIG. 9 shows a cross-section of a typical structure 100, and a graph of capacitance versus displacement, showing the variation in capacitance measured as a suitable capacitance probe traverses the test structure. FIG. 10 shows a schematic perspective view of an apparatus for practicing this aspect of the invention.

Thus, FIG. 9 shows a cross-section of a test structure 100 comprising a number of conductive elements 102, 104, 106 on a substrate 108 having dielectric material 110 formed thereover and patterned to define vias 112, 114, that is, areas where the dielectric material 110 is absent, exposing the conductive material 104. If, as indicated generally in FIG. 10, a capacitance probe 116 is moved laterally over the structure 100 and a suitable capacitance meter 117 is connected between probe 116 and conductive elements 102, 104, 106, the measured capacitance therebetween will vary substantially as indicated at 120 in FIG. 9. As there shown, the capacitance reaches a maximum value, as indicated at 122, 124, where the dielectric material 110 is present over conductive members 102, 104, 106; exhibits a lower value at 126, 128, where the probe is over vias 112, 114 from which the dielectric material is absent, exposing the conductive material; and reaches its lowest value 130, 132, 134 at points where the dielectric material 110 is present, but where there is no underlying conductive material. Accordingly, by analysis of the capacitance signal 120, the presence of conductive members 102, 104, 106 and the accuracy of alignment of the vias 112, 114 with respect thereto, that is, the overlay, can conveniently be measured. For example, vias 112, 114 may be configured as features 78 in the test structure of FIGS. 5 and 6, with underlying conductors 102, 104, 106 providing test points 74; the row where the features are best aligned with the test points can be located by passing the capacitative probe along each row in turn, that is, over the locations of each test point, and examining the capacitative signal 120. The overlay might correspond to the relative displacement of a central section of dielectric 110 and conductor 104, as shown. Null-overlay elements identified by such electrostatic measurements could then be conveniently correlated with optical measurements of reference marks and members formed in fixed spatial relation to the features, e.g., as at 72 and 76 in FIGS. 5 and 6, to conveniently calibrate an optical instrument.

Further, it will be appreciated by those of skill in the art that a capacitative measurement as thus described could also be supplanted or supplemented by inductive or impedance measurements or by combinations thereof, all depending on the precise nature of the structure to be examined.

It is further within the contemplation of the invention to employ capacitance or related non-resistance techniques to locate structures formed on the reverse side of a substrate, e.g., to locate conductive members 140, 142, 144 formed on the rear side of the substrate 108 (see FIG. 10). Such members can be located by performing non-contact electrical measurements according to the invention; e.g., by measuring variation in the capacitance of the structure surrounding members 140, 142, 144, their location may be detected precisely. Accordingly, this is also considered to be within the scope of the invention.

Reference has been made in the foregoing to calibration of imaging tools, again including in this term both optical and electron microscopes and like devices, by measuring the physical spacing of features on a substrate using these imaging tools and correlating these measurements by reference to comparable measurements made using electrical tools, employing resistance techniques, capacitance-measuring techniques, or further possibilities. It will be appreciated that the capacitative signal 120 can also be analyzed to determine the width of the features of the structure, e.g., the width of conductive members 102, 104, 106 (FIG. 9). Measurement of the dimensions of features, such as the widths of conductive lines, using non-contacting electrical techniques, with or without correlation thereof to measurements of the same features using imaging instruments, is thus within the scope of the invention.

More specifically, while voltage measurements as described in the parent application and issued patent provide one measurement of line width which can be correlated with an optically measured line width, a further technique for measuring line width may be provided by capacitance measuring techniques as described above in connection with FIGS. 9 and 10. The width of conductor 102 in FIG. 9, for example, is well delimited by the variation in capacitance illustrated at 122 in FIG. 9. Again, such capacitance measurements are intended to be included within the phrase "electrical measurements" as used herein with respect to calibration of an imaging-instrument measurement in order to eliminate the contribution of wafer-induced shift to such imaging tool measurements of line width.

Electrical measurement techniques other than resistance measurements, that is, capacitive, inductive, or impedance measurements, may also be used to statistically separate out contributions of tool fabrication errors and feature misplacement errors, using techniques discussed above and in further detail in parent application Ser. No. 08/236,202. For example, the test structures shown in FIGS. 5 and 6 may be formed using the same masks and other tools at a plurality of exposure sites on a wafer; if common errors are located in each structure at a particular site, the tool is misregistered; if corresponding portions of the structure at each site exhibit the same error, the tool has been formed improperly.

In the above, extensive reference has been made to making electrical measurements in a manner which allows the overlay between two patterned layers of a structure formed in a series of operations to be evaluated. As indicated generally above, e.g., in connection with FIG. 4, one way to do this is simply to form a contact element extending through a via in an insulative layer disposed between an upper patterned conductive layer and an underlying patterned conductive lower layer, and measure the resistance therebetween. FIGS. 5 and 6 show one embodiment of composite test structures for "null overlay" evaluation, in which one component of each of a number of such "test structure elements" 69 is spaced progressively greater distances from a baseline, fixed with respect to a further component of each element, providing varying "designed-in" overlays. The element exhibiting the minimum resistance is the "null overlay" element. Such elements may take various forms, as illustrated by FIGS. 11–14.

FIG. 11 shows a simple test structure element, comprising a first conductor 160 which may correspond, for example, to a portion of the underlying conductors 70 of FIGS. 5 and 6, or to conductors 52" of FIGS. 4(a)–4(e), formed in a patterned lower conductive layer. An intervening insulative layer (not shown) is then formed to define a via extending therethrough; in a subsequent deposition step, a columnar connecting post 161 (shown as an idealized cylindrical member) is formed extending through the via. Post 161 provides electrical connection between conductor 160 and an overlying conductor 164, which may be provided in a separate subsequent deposition step, or may be formed integrally with post 161. If a resistance meter 166 is connected between conductors 164 and 160, the resistance measured is indicative of the alignment of the post 161 with respect to the underlying conductor 160, and hence of the overlay; that is, the overlay, as shown by arrow 163, is zero when the "contact patch" 162, corresponding to feature 78 in FIGS. 5 and 6, whereby current flows between post 161 and conductor 160, is centered with respect to the underlying conductor 160 in the direction 163 with respect to which the overlay is being evaluated. As noted, a number of test structure elements as in FIG. 11 may be provided with varying designed-in overlays, that is, wherein the position of their contact patches 162 varies progressively with respect to the corresponding conductor 160. Comparison of the resistances measured with respect to each identifies the "null overlay" test structure element, having its contact patch 162 essentially centered on conductor 160. The structure of FIG. 11 is fully suitable for practice of this aspect of the invention as described above.

FIG. 12 shows an alternative test structure element which can be used to make corresponding measurements. In this case, the underlying patterned conductive layer 166 defines a cruciform conductive member, including one elongated portion extending in the direction with respect to which the overlay is being evaluated, as indicated by arrow 169, between opposed ends A and B, e.g., at 167 and 168, and also includes at least one orthogonal leg 170. Leg 170 may be a portion of a continuous elongated conductor, such as conductor 70 of FIG. 5. A second leg 171 may also be provided. In a series of subsequent deposition steps, a post 173 defining contact patch 174 is provided extending through a via in an intermediate insulative layer (not shown), for connection to an overlying conductor 172.

In a series of test elements of the FIG. 11 embodiment, each having increasing overlay, the contact patch 162 would eventually be located partially or wholly off conductor 160, to one side or the other, such that the resistance measured would increase significantly. In the structure of FIG. 12, the size of the contact patch 174 will not vary greatly with significant overlay in the direction indicated by arrow 169, that is, although post 173 will be disposed towards one of ends A or B with increasing overlay, a full-size contact patch 174 will still be formed. Accordingly, simply monitoring the resistance of the contact patch 174 is insufficient to identify the null-overlay test structure element. In this case, the overlay is evaluated by forcing a current between conductors 172 and 170, as indicated by legend 175, and measuring the voltage across the legs 167 and 168, i.e., between points A and B, as indicated by legend 176. The sign of the voltage drop between points A and B allows the direction of the overlay, that is, the direction in which contact patch 174 is offset with respect to the centerline of conductor 170, to be evaluated; further, while the distance by which the contact patch 174 is displaced to one side or the other cannot be reliably evaluated by measurement of the voltage drop between points A and B, if a number of such elements are fabricated with varying designed-in overlays, e.g., as in FIGS. 5 and 6, that exhibiting the lowest voltage between the corresponding points A and B thereof will be the null-overlay element, with respect to which the contact patch 174 is best centered with respect to the corresponding conductive leg 170.

According to this aspect of the invention, a direct measurement of overlay can be made, in the sense that a "null overlay" test structure element can be identified as that having the best alignment of the contact patches 174 of the test structure elements, i.e., the minimal overlay, in this case of the via with respect to the lower conductor. As discussed extensively above, the same structure can then be evaluated optically to calibrate an optical instrument, e.g., by extending corresponding portions of the upper and lower structures to form a bars-in-bars or frame-in-frame structure. More particularly, however, as opposed to the structure of FIG. 11, wherein the measured resistance varies stepwise from one structure to the next and may in fact merely permit only "good contact" or "no contact" to be determined with respect to each of a set of test structure elements, the test structure element shown in FIG. 12, if replicated with gradually increasing designed-in overlay, will provide a corresponding gradually-varying series of values for the voltage measured between points A and B, which can be used to identify the null overlay test structure element in a series of such elements making up a test structure. As noted, the sign of the voltage between points A and B in FIG. 12 will differentiate a "left-ward" overlay with respect to a nominal contact patch location from a "right-ward" overlay.

A third connection may also be made to point D, on rearwardly extending leg 171, and differential voltage measurements made between points A and D and points D and B. Similar differential voltage measurements might be made between points A and C and C and B. If legs 170 and 171 are part of a continuous elongated conductor, e.g., conductor 70 of FIG. 5, such measurements are equivalent. Measurements of this type may be useful for quantitative measurement of overlay.

FIG. 13 is a perspective view showing three test structure elements 180 in a further embodiment of test structure elements for null-overlay detection. The elements of FIG. 13 exhibit increased rightward overlay in the dimension indicated by arrow 187 towards the upper portion of the drawing. In this case, each test structure element 180 comprises left and right conductive posts 181, 182, respectively, connected to conductors 183, 184 for external connection. As shown by FIG. 13, the conductive posts 181, 182 are spaced slightly closer than the width of an underlying conductor 185, such that the null test structure element is that in which conductors 181 and 182 both contact the underlying conductor 185. In the example of FIG. 13, the central of the three test structure elements 180 is shown with both conductive posts 181, 182 in contact with the conductor 185, such that the central test structure element would be the null overlay element. Identification of the null overlay element in this embodiment would simply involve applying a voltage successively across the paired conductors 183 and 184, and determining when current flows, to identify the test structure element having continuity.

Still a further possibility is shown in FIG. 14, wherein the overlay measured in a dimension indicated by arrow 190 is responsive to the lateral position of an upper conductor 191 with respect to a "window" 192 formed over a lower conductor 193, that is, by provision of a slot-like window in a dielectric layer (the "frame" of this "window" being shown at 192) spacing the lower conductor 193 from the upper conductor 191. It will be appreciated that this does not reflect the usual semiconductor fabrication practice. As indicated by arrow 190, the overlay is responsive to the lateral disposition of the upper conductor 191 along the slot 192 above the lower conductor 193.

In the test structure elements of FIGS. 11–13, the alignment of posts formed in vias with respect to the corresponding lower conductors determines the overlay, and hence the alignment of the vias in the insulative layer whereby the posts are formed controls the overlay. As measurement of overlay according to the invention thus evaluates the integrity of connections between spaced conductive layers, the test structure elements shown in FIGS. 11–13 provide measurements of overlay directly responsive to the needs of the industry.

More specifically, although the overlay is commonly described as a measure of the alignment of the upper conductive layer (e.g., conductor 164 in FIG. 11) with respect to a lower layer (e.g., conductor 160 in FIG. 11), in fact, the location of the via extending between the two conductors (regardless whether a discrete post or an extension of the upper conductor actually extends through the via) is of direct significance in determining whether the circuit will perform properly. Accordingly, the location of the via in the dielectric layer spacing the two conductive layers is the structural element of direct interest.

For this reason, one pair of the bars of a bars-in-bars or frame-in-frame structure discussed above and employed according to one aspect of the invention to calibrate an imaging instrument are usually formed in the lower conductor, corresponding to conductor 160 in FIG. 11, while the other pair of bars simply consists of channels, that is, essentially elongated vias, in the insulative layer used to form the posts 161 (FIG. 11) interconnecting the various conductive layers. Accordingly, where reference is made herein to comparison of upper and lower conductive layers using these techniques, it should be understood that normally the comparison is of the alignment of the structure connecting the two, as this is of direct interest to the IC manufacturer. For example, if the elements exhibiting progressively greater overlay in FIGS. 5 and 6 are fabricated to comprise connecting posts formed in vias, the overlay is responsive to the accuracy of alignment of the vias in the insulative layer with respect to the lower layer.

More specifically, it will be appreciated that the overlay amounts to the net misregistration of a tool used to form a later-formed component of a structure with respect to an earlier-formed component. For example, in the structure of FIG. 11, location of the via used to form post 161 determines the overlay with respect to the dimension along which arrow 163 extends. The bars-in-bars structure 72, 76 (FIG. 5) provides a corresponding optical measurement of overlay in that dimension. Of course, a similar measurement could be made with respect to the alignment of the vias with respect to the upper conductor, and this would be of generally similar significance. Such a similar measure of overlay in the orthogonal dimension, e.g., responsive to the location of an upper contact patch 165 with respect to the orthogonally-extending conductor 164, would involve a second set of test structure elements extending perpendicularly to those of FIGS. 5 and 6. To calibrate an optical instrument in the direction orthogonal to arrow 163 would likewise require a second bars-in-bars structure responsive to the respective location of the upper conductive structure 164 with respect to the vias in the insulative material used to form post 161.

Thus, it will appreciated that reference herein to measurement of the relation between upper and lower structures should be understood to include evaluation of the location of vias separately with respect to conductors extending in orthogonal directions, and that overlay properly characterized involves measurements in such orthogonal dimensions.

Returning now to the discussion of the test structure element of FIG. 14, because a slot 192 is formed in the insulative layer, through which an upper conductor 191 directly contacts the lower conductor 193, significant overlay of the slot in the dimension represented by arrow 190 does not affect the integrity of the connection. In this case, the overlay of the upper conductor 191 with respect to the lower conductor 193 in the dimension represented by arrow 190 is directly measured. However, inasmuch as the contact patch 196 is still defined by the location of the via with respect to the lower conductor in the orthogonal dimension represented by arrow 195, the overlay in this dimension is responsive to the accuracy of location of the via or slot 192 in the insulative layer with respect to the lower conductor 193. Thus, the FIG. 14 structure provides a direct measurement of overlay between two conductors in one dimension 190, but in the orthogonal direction 195 allows evaluation of overlay of vias in the intervening insulative layer with respect to the lower layer.

FIG. 15 shows a further improvement according to the present invention, wherein null overlay detection is combined with the test structures disclosed in the parent application Ser. No. 08/236,202 and the grandparent Ser. No. 07/852,439, now U.S. Pat. No. 5,383,136. A basic ("MOATS") test structure as discussed in detail in the parent and grandparent applications includes a bridge conductor 202 having a number of voltage-measuring pads 204, 205, 208 connected to the bridge conductor 202 by taps 206, 209, 210 respectively. As discussed in the parent and grandparent applications, such a structure can be used to measure the accuracy whereby a later-added tap and pad assembly, e.g., tap 211 and pad 207, is spaced between similar assemblies on either side.

According to the present invention, a further conductive connection 216 is made to bridge 202 from an overlying layer, or is subsequently formed by partial removal of a larger element formed integrally with bridge conductor 202. As discussed above, e.g., in connection with FIG. 12, a current is forced between connection 216 and a corresponding tap 211 while the voltage is measured between taps spaced along a line essentially perpendicular to a line connecting the connection 216 and the corresponding tap 211, e.g., between taps 209 and 210. "Dummy taps" indicated generally at 228 would desirably be provided between taps 205 and 209, as discussed in the parent and grandparent applications. For combining null-overlay detection with a linear measurement of offset according to the parent and grandparent applications, a plurality of the test structures 200 of FIG. 15 could be provided; the locations of connections 216 would vary linearly with respect to a baseline fixed with respect to tap 211, which in this case would be formed integrally with taps 206, 209, and 210, so as to be located in fixed relation thereto. Null-overlay detection could then be preformed according to the present invention, in combination with measurement of the location of tap 216, i.e., the offset, by differential voltage drop measurement, e.g., between taps 209 and 210, as disclosed in the predecessor applications.

As noted, in using the FIG. 15 structure for null detection according to the present invention, a current is forced between connection 216 and tap 211, and voltage measurements made between taps 209 and 210. Alternatively, a voltage measurement made between tap 209 and connection 216 could be compared to a voltage measurement between connection 216 and tap 210; similar differential voltage measurements could be made between tap 209 and an optional further tap 215 (necessitating appropriate dummy tap architectures 218) and between taps 215 and 210. These voltage measurements may be compared to identify a null-overlay element wherein connection 216 is most closely aligned with tap 211. For linear evaluation of the displacement of connection 216 with respect to a nominal location according to the predecessor applications, a current is forced along bridge conductor 202 and differential voltage measurements made between, e.g., tap 209 and connection 216 and connection 216 and tap 210.

The above method effectively measures the location of a via used to form connection 216, i.e., the overlay of a multiple-layer structure. Those of skill in the art will recognize that connection 216 could equivalently be fabricated as a wide member in the same conductive layer as bridge conductor 202, and have material subsequently removed to define a narrow tap; the overlay of the material removal tool used to define the location of a subsequently-formed feature with respect to a first-formed feature would thus be similarly evaluated. A similar equivalent is found in the predecessor applications.

The advantage of providing the null overlay detection structure according to the present invention in combination with a larger test structure providing functions disclosed and claimed in the parent and grandparent applications, as shown in FIG. 15, is that if a number of such test structures are provided, the null-overlay detection techniques discussed above can be used to identify the minimal overlay test structure element. This in turn can be used to evaluate one of the parameters appearing in the equations discussed in parent and grandparent applications, and thus lead to better-specified test structures.

More specifically, suppose that a number of the test structures shown in FIG. 15 are provided with contacts 216 to an overlying conductive layer and disposed successively greater distances from a baseline, as in the FIGS. 5 and 6 test structure. If the overlay of each is measured using the technique discussed above in connection with FIG. 12, one of the structures will exhibit a minimum or "null" overlay value. This is shown schematically by curve 230 in FIG. 16, illustrating the voltage V, e.g., across taps 209 and 210 as a function of the nominal position of the contact 216 from the baseline; that is, the null overlay structure is identified by the minimum value of the measured voltage.

By comparison, the equations for measuring the displacement of a center conductor with respect to associated conductors made using the test structures according to the invention of the parent and grandparent applications provides a generally straight line function 232. Function 232 corresponds to equation 12 in the parent application, and to equation 5 in U.S. Pat. No. 5,383,136 issued on the grandparent application. This equation essentially provides a value for the term $(x+\Delta t)$, x being the displacement of a center conductor added in a second layer with respect to a designed center line, x thus typically corresponding to the overlay, and $\Delta t$ being an unavoidable and not readily quantifiable effect caused by asymmetric inside corner rounding. ($\Delta t$ is thus an electrical analog to WIS, as discussed above.) In the prior applications, x and $\Delta t$ cannot be separately evaluated.

Thus, although the overlay as measured using the test structures of the parent and grandparent applications is a linear function, the exact contribution x of the physical misalignment cannot be determined. Comparably, imaging-instrument measurements of overlay are linear, but cannot be calibrated without recourse to an independent measurement, due to TIS and WIS. By comparison, null-overlay measurements according to the invention allow a "best-aligned" test structure element to be identified from a series of test structure elements, but the overlay cannot be evaluated in a quantitative, i.e., linear manner, using such a structure; this is why line 230 is curved. Accordingly, according to the invention, a linear measurement technique—either imaging-instrument measurement, or measurement using the structure of the parent and grandparent applications—is combined with null-overlay detection; in effect, the latter calibrates the former.

According to the present invention, the value for $\Delta t$ as measured by the structures shown in the parent and grandparent applications is effectively the height of line 232 at the zero overlay point marked on FIG. 16, i.e., at the test structure location identified by the minimum of curve 230. This value for $\Delta t$ can then be substituted back into the equations mentioned and used to derive a better value for the displacement x, which is typically equal to the actual physical overlay of the second layer with respect to the first. Moreover, structures formed integrally with the first- and later-formed components of the null overlay test structure element may be physically extended to serve as a target for an optical microscope or other imaging instrument, so that the null overlay indication thus derived electrically can be used directly to calibrate the imaging instrument.

Still more particularly, according to this latter aspect of the invention, a series of test structures each having successively increasing designed-in overlays may be provided on the actual substrate of a circuit element being fabricated, and can be used to determine the actual overlay thereof so as to correctly calibrate an optical instrument according to the object of the invention originally mentioned above.

Therefore, according to the invention a test structure is provided which can be qualified, that is, the integrity of which can be verified by electrical measurements, and which is also inspectable by imaging metrology tools, to calibrate the latter. In a further embodiment, a number of test structures each exhibiting various values for overlay can be examined electrically to determine the actual overlay. This result can then be used directly for control of the fabrication process, or may be correlated with measurements made with respect to the same structure using optical techniques, to calibrate the optical instrument.

Summarizing the advantages of the present invention, it will be appreciated by those of skill in the art that while measurements of overlay made using imaging instruments are subject to TIS and to WIS, these measurements generally vary linearly with actual overlay. Measurements made using the test structures disclosed in the parent and grandparent applications and discussed in connection with FIG. 15 hereof are not subject to TIS, are subject to an electrical analog of WIS only to a very small degree, and also provide measurements of overlay varying linearly with the actual overlay, but require calibration, in effect, for the $\Delta t$ term. By comparison, the zero-overlay detectors exemplified by FIGS. 5, 6, and 11–14 of this application are not subject to TIS nor to WIS; while the measurements of overlay provided thereby are non-linear (as shown by line 230 of FIG. 16), the test structures of the invention permit identification of a null-overlay test structure element from a series of test structure elements provided as part of an overall test structure. Therefore, combination of the null-overlay detectors of FIGS. 5, 6, and 11–14 with a bars-in-bars or frame-in-frame target for imaging-instrument measurements, or additionally or alternatively with the test structure of the predecessor applications, as in FIG. 15, allows identification of a null-overlay test structure element and linear measurement of overlay, the null-overlay point having thus been determined. Accordingly, therefore, the null-overlay detectors shown herein are ideally combined with one or both of measurements made using imaging instruments or electrical measurements using the test structure shown in the parent and grandparent applications to yield a test structure that can be calibrated or "zeroed" using the null-overlay detectors and thereafter used for linear measurements of actual overlay.

While the invention has been described with a certain degree of particularity and with respect to certain preferred embodiments thereof, it is manifest that many changes may be made in the details of construction and the arrangement of components without departing from the spirit and scope of the disclosure. It is understood that the invention is not limited to the embodiments set forth herein, but is to be limited only by the scope of the appended claims including the full range of equivalency to which each element thereof is entitled.

We claim:

1. A method for calibrating an imaging instrument with respect to measurements of distance between features of a structure formed in a sequence of steps on a substrate, measurements made by said imaging instrument being susceptible to one or both of tool-induced shift (TIS) and wafer-induced shift (WIS), comprising the steps of:

forming a structure comprising components formed in a sequence of steps on a substrate, said components of said structure each comprising first artifacts the spacing of which is measurable using said imaging instrument, and also comprising second artifacts the spacing of which is analyzable using electrical measurement techniques not susceptible to TIS or WIS, said first and second artifacts being in defined physical relation to one another;

measuring the spacing of said first artifacts employing said imaging instrument;

analyzing the spacing of said second artifacts employing said electrical measurement technique; and calibrating said imaging instrument responsive to comparison of said measurements and analyses.

2. The method of claim 1, wherein said step of forming a structure on a substrate comprises the steps of:

providing a substrate;

forming a first patterned conductive layer on said substrate in a first fabrication step, said first layer being patterned to define reference members detectable by said imaging instrument to be calibrated, and further defining a number of test points in fixed spatial relation to said reference members; and forming a second layer of a second material overlying said first layer in a subsequent fabrication step, said second layer being patterned to define reference marks detectable by said imaging instrument for measurement of the relation thereof to said reference members defined by said first layer, and to further define a series of features spaced successively greater distances from a baseline in fixed spatial relation to said reference marks;

said features being such that the positions of the features with respect to said test points are determinable employing an electrical technique;

wherein said step of measuring the spacing of said first artifacts employing said imaging instrument comprises the step of measuring the spatial relation of the reference marks with respect to the reference members employing said imaging instrument;

wherein said step of analyzing the spacing of said second artifacts employing said electrical measurement technique comprises the step of performing a series of electrical measurements with respect to each of said features, wherein said electrical measurements provide a measured value corresponding to the degree of alignment of each feature to an underlying test point, and comparing the electrically-measured values in order to determine which of the features most closely approaches a predetermined relation to the corresponding test point, to provide a value for the spatial relation of the first and second layers not affected by TIS or WIS; and wherein said step of calibrating said imaging instrument responsive to comparison of said measurements and analyses is performed by comparing the measurement of the spacing of the reference marks with respect to the reference members made employing said imaging instrument to the value for the spatial relation of the first and second layers not affected by TIS or WIS made using said electrical technique.

3. The method of claim 2, wherein said test points defined by said first layer are points spaced along an elongated conductor extending substantially parallel to said baseline, and said features defined by said second layer of said second material comprise conductive members overlying said elongated conductor, such that the alignment of said features is determined by measuring the resistance between the conductive members and the underlying conductor.

4. The method of claim 1, wherein said imaging instrument is an optical microscope.

5. The method of claim 1, wherein said imaging instrument is an electron microscope.

6. The method of claim 1, wherein said electrical measurement technique comprises the steps of forcing a current through physically contacting electrically conducting portions of said structure, and measuring the resistance therebetween, in order to evaluate the degree of alignment of said portions.

7. The method of claim 1, wherein said electrical measurement technique comprises the steps of disposing a probe in close juxtaposition to said structure, applying a test signal between said probe and said portions of said structure, and measuring one or more of the relative capacitance, inductance, or impedance therebetween, in order to evaluate the degree of alignment of said portions.

8. A method for calibrating optical measurements of overlay exhibited with respect to successive steps in fabrication of a multiple-layer planar product, comprising the steps of:

provinding a test structure comprising:
a substrate;
a first conductive layer, formed on said substrate in a first fabrication step, and patterned to define optically-detectable reference members, and to further define a number of test point locations in fixed spatial relation to said reference members; and
a second layer of a second material formed overlying said first layer in a subsequent fabrication step, said second layer being patterned to define optically-detectable reference marks for optical measurement of the relation thereof to said reference members defined by said first layer, and to further define a series of features spaced successively greater distances from a baseline in fixed spatial relation to said reference marks;
said features being such that the positions of the features with respect to said test points are determinable employing an electrical technique;
optically measuring the spatial relation of the reference marks with respect to the reference members, to derive an optically-measured value for overlay of the first and second layers;
performing a series of electrical measurements with respect to each of said features, to derive a series of electrically-measured values for overlay, each responsive to the degree of alignment of the corresponding feature to an underlying test point;
comparing the series of electrically-measured values in order to identify a null-overlay feature most closely approaching a predetermined relation to the corresponding test point; and
correcting the optically-measured value for the overlay accordingly.

9. The method of claim 8, comprising the further steps of forming at least one such test structure at each of a plurality of exposure sites on a single substrate, and stepping a tool used to form the second layer of each test structure at each exposure site between successive exposure sites prior to each of the subsequent fabrication steps.

10. The method of claim 8, wherein at least three such test structures are formed at each of said plurality of exposure sites on a single substrate, said tool being used to form the second layer of each test structure simultaneously at each exposure site.

11. The method of claim 10, comprising the further step of analyzing the electrically-measured values indicating which of the features most closely approaches a predetermined relation to the corresponding test point with respect to each test structure formed at each exposure site in order to discriminate between tool-induced shift, wafer-induced shift, and other sources of error in fabrication of said layers.

12. The method of claim 8, wherein said first layer is patterned to define an elongated conductor extending substantially parallel to said baseline, and said features defined by said second layer of said second material comprise conductive members overlying said elongated conductor at spaced test point locations therealong.

13. The method of claim 12, wherein said conductive members directly contact the underlying elongated conductor, and wherein said step of electrical measurement is performed by successively forcing a current between each of the conductive members and the underlying conductor and measuring the electrical resistance therebetween.

14. The method of claim 13, wherein said step of comparing the series of electrically-measured values in order to identify a null-overlay feature is performed by comparing the resistances thus measured, and selecting the conductive region exhibiting the minimal resistance with respect to the underlying conductor as the null-overlay feature.

15. The method of claim 8, wherein said first layer is patterned to define an elongated conductive member parallel to said baseline, and wherein said features of said second layer define the locations of conductive members contacting said elongated conductive member at said successively greater distances from said baseline.

16. The method of claim 15, wherein said step of performing a series of electrical measurements with respect to each of said features is performed by successively forcing a current between said conductive members and said elongated conductor, and measuring the resistance therebetween.

17. The method of claim 15, wherein said first layer is further patterned to define a series of transverse conductive members at said test point locations along said elongated conductor, and wherein said step of performing a series of electrical measurements with respect to each of said features is performed by successively forcing a current between said conductive members and said elongated conductor, and measuring a voltage between the ends of the corresponding transverse members.

18. The method of claim 17, wherein said step of performing a series of electrical measurements with respect to each of said features is performed by successively forcing a current between said conductive members and said elongated conductor, and measuring differential voltages between the ends of the transverse members and the center thereof.

19. The method of claim 8, wherein said first layer is patterned to define an elongated conductive member parallel to said baseline, and wherein each of said features comprises two conductive members defined by said second layer at each of said test points, said two conductive members of each feature being spaced from one another in a direction perpendicular to said baseline by a distance less than the width of said elongated conductive member, such that both said conductive members of a null-overlay feature contact said elongated conductive member.

20. The method of claim 8, wherein said test points defined by said first layer are spaced along an elongated conductor extending substantially parallel to said baseline, and said features defined by said second layer of said second material comprise features formed in dielectric material overlying said elongated conductor at spaced locations therealong.

21. The method of claim 20, wherein said step of electrical measurement is performed by applying an electrical test signal to each of the features, and measuring one of the electrical resistance, capacitance, inductance, or impedance between the feature and the underlying conductor.

22. The method of claim 21, wherein said step of comparing the series of electrically-measured values in order to identify a null-overlay feature is performed by comparing the measured values for the electrical resistance, capacitance, inductance, or impedance.

23. A test structure enabling calibration of imaging instruments for measurement of overlay as experienced during fabrication of products formed in multiple-step processes, measurements of overlay as made by such imaging instruments being susceptible to one or both of tool-induced shift (TIS) and wafer-induced shift (WIS), said structure comprising a first component formed in a first step and at least a second component formed in a second step, said first and second components together defining a number of artifacts on said substrate, an electrical characteristic of each of said artifacts varying in accordance with the relative alignment of the first and second components thereof, such that the relative alignment of said first and second components comprised by each of said artifacts are measurable using said imaging instrument to be calibrated and using electrical measurement techniques not susceptible to TIS and WIS.

24. The test structure of claim 23, wherein said artifacts each comprise:

a first conductive layer, formed on a substrate in a first fabrication step, and patterned to define reference members detectable employing an imaging instrument; and a second layer of a second material formed overlying said first conductive layer in a subsequent fabrication step, said second layer being patterned to define reference marks detectable by said imaging instrument, for measurement of the relation thereof to said reference members defined by said first conductive layer employing said imaging instrument to be calibrated, said first and second layers collectively defining a series of features, each feature being space a successively greater distance from a baseline fixed with respect to said reference marks; and wherein the position of each feature with respect to said baseline is determinable employing an electrical technique.

25. The test structure of claim 24, wherein the position of one of first and second members of each feature varies with respect to said baseline, and wherein an electrical characteristic of each feature may be measured to identify a null-overlay feature.

26. The test structure of claim 25, wherein the material of said second layer is conductive, and wherein said features defined collectively by said first and second layers comprise first and second members in electrical contact with one another, such that the measured electrical characteristic of each feature is the resistance therebetween.

27. The test structure of claim 25, wherein the material of said second layer is a dielectric, and wherein the relation of members of said features defined by said second layer with respect to members thereof defined by said underlying conductive layer can be determined using a non-contacting electrical technique.

28. The test structure of claim 27, wherein said non-contacting electrical technique comprises applying a test signal at intervals across the surface of said structure, and monitoring variation in the capacitance, impedance, or inductance exhibited thereby as a function of position.

29. The test structure of claim 28, wherein the relative alignment of said first and second components of said artifacts is determined by measurement of the capacitance, impedance, or inductance therebetween.

30. A test structure for null-overlay detection, comprising a number of test structure elements, each test structure element comprising a first-formed member and a second-formed member, wherein one of each of the first-formed and second-formed members of each test structure element is located in fixed relation to a baseline and the other of each of the first-formed and second-formed members of each test structure element is spaced a progressively greater distance from said baseline in a direction perpendicular thereto, and wherein the relative alignment of said first-formed and second-formed members of each test structure element may be evaluated to identify one thereof as a null-overlay test structure element.

31. The test structure of claim 30, wherein said first- and second-formed members are conductive, and the relative alignment thereof is evaluated by measuring the electrical resistance therebetween.

32. The test structure of claim 31, wherein said second-formed members are located by formation in vias in insulative members disposed over said first-formed members.

33. The test structure of claim 32, wherein said first-formed members of each test structure element are defined by an elongated conductor extending generally parallel to said baseline.

34. The test structure of claim 33, wherein said first-formed member of each test structure element further defines a conductive element extending transverse to said elongated conductor.

35. The test structure of claim 33, wherein said second-formed members of each test structure element each comprise a pair of conductive members spaced from one another in a direction perpendicular to said baseline by a gap of width less than the width of said elongated conductor.

36. The test structure of claim 30, wherein said first-formed member of each test structure comprises an elongated bridge conductor having a plurality of taps connected thereto for measuring voltages therebetween responsive to a current forced along said bridge conductor, each test structure element further comprising a second-formed conductor connected to said bridge conductor.

* * * * *